(12) United States Patent
Shields et al.

(10) Patent No.: US 6,864,501 B2
(45) Date of Patent: Mar. 8, 2005

(54) PHOTON SOURCE AND METHOD OF ITS FABRICATION AND OPERATION

(75) Inventors: Andrew James Shields, Cambridge (GB); Richard Mark Stevenson, Cambridge (GB); Beata Ewa Kardynal, Cambridge (GB); Zhiliang Yuan, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 10/262,082

(22) Filed: Oct. 2, 2002

(65) Prior Publication Data

US 2003/0127608 A1 Jul. 10, 2003

(30) Foreign Application Priority Data

Oct. 2, 2001 (GB) .............................................. 0123682

(51) Int. Cl.[7] .............................................. H01L 33/00
(52) U.S. Cl. .............................. 257/13; 257/21; 257/25; 257/96; 257/97; 438/47
(58) Field of Search .............................. 257/13, 21, 17, 257/25, 96, 97; 438/47

(56) References Cited

U.S. PATENT DOCUMENTS

| | | | |
|---|---|---|---|
| 4,961,196 A | 10/1990 | Endo | |
| 5,386,429 A | 1/1995 | Naito et al. | |
| 5,442,649 A | 8/1995 | Kokubo et al. | |
| 5,607,876 A | 3/1997 | Biegelsen et al. | |
| 6,177,684 B1 * | 1/2001 | Sugiyama | 257/17 |
| 2002/0081825 A1 * | 6/2002 | Williams et al. | 438/493 |

FOREIGN PATENT DOCUMENTS

| | | |
|---|---|---|
| GB | 2 362 261 A | 11/2001 |
| GB | 2 366 666 A | 3/2002 |
| GB | 2 367 690 A | 4/2002 |
| GB | 2 378 575 A | 2/2003 |
| JP | 6-188507 A | 7/1994 |
| JP | 2000-332302 A | 11/2000 |
| JP | 2001-144379 A | 5/2001 |

OTHER PUBLICATIONS

Fiore et al, IEEE J of Q. Elec. vol. 37, No. 8, Aug. 2001, "Structural . . . Arsenide" pp. 1050–1058.*
Kim et al, Nature vol. 397 Feb. 11, 1999 "A single–photon turnstile device" pp. 500–503.*
Brassard et al., "Limitations on Practical Quantum Cryptography", Physical Review Letters, vol. 85, p 1330–1333, (2000).
Michler et al., "A Quantum Dot Single–Photon Turnstile Device", Science, vol. 290, p 2282–2285 (2000).
Santori et al., "Triggered Single Photons from a Quantum Dot", Physical Review Letters, vol. 86, p 1502–1505 (2001).
Benson et al., "Regulated and Entangled Photons from a Single Quantum Dot", Physical Review Letters, vol. 84, p 2513–2516 (2000).

* cited by examiner

*Primary Examiner*—Jerome Jackson
(74) *Attorney, Agent, or Firm*—Oblon, Spivak, McClelland, Maier & Neustadt, P.C.

(57) ABSTRACT

A photon source includes a photon source body including quantum dots, a non-insulating layer overlying and in contact with the quantum dots, and an electrical contact that allows electrically activated emission of radiation from at least one of the quantum dots. An active region is defined within the photon source body such that emission is only collected from a dot or a limited number of dots within the active region.

37 Claims, 31 Drawing Sheets

PHOTON SOURCE AND METHOD OF ITS FABRICATION AND OPERATION

The present invention relates to the field of photon sources which are capable of emitting a predetermined number of photons at predetermined times. More specifically, the present invention relates to such a photon source which is electrically activated.

There is a need for single and entangled-pair photon sources for use in quantum information technology. In quantum cryptography, bits can be exchanged on an open optical network along with an estimate of the probability that they were intercepted en-route. This can be used to form a cryptographic key for subsequent confidential communication over a network.

The security of the technique relies upon the bits being encoded upon a quantum state such as a single photon, since measurement of a quantum state causes a disturbance which can be detected by the sender and intended recipient of the bits. Any bits encoded upon two or more photons threaten the security of the technique, because they allow the possibility that a third party could perform a measurement on one of the photons, while allowing the others to be received by the intended recipient undisturbed, thus masking their intervention.

Unfortunately weak laser pulses, which previously have been used for demonstrations of quantum key distribution, contain an unavoidable fraction of multi-photon pulses. If the average number of photons per pulse is $\mu$, the fraction of multi-photon pulses is given by $\mu^2/2$. Recently the security threat posed by the multi-photon pulses of weak laser beams was highlighted by Brassard et al, Physical Review Letters 85 p 1330 to 1333, 2000. They showed that the multi-photon pulses place a severe limitation on the longest fibre which can be used for secure key distribution.

Pairs of photons may also be used for key distribution, as well as other applications in quantum information technology. Entangled pairs have the property that a measurement of one of the pair affects the state of the other, even if they are in different locations. Thus by separating the two entangled photons and directing them to two parties it is possible to form a key between the two parties. Attempted interception of one of the photons by a third party breaks the entanglement of the pair, which can be detected by the intended recipients.

A number-state source is also useful as a low-noise source for optical imaging, spectroscopy, laser ranging and metrology. Normal light sources suffer from random fluctuations in the photon emission rate at low intensities due to shot noise. This noise limits the sensitivity of many optical techniques where single photons are detected. A source which provides a fixed number of photons at regular time intervals has a reduced shot noise.

Recently, advances have been made in making such single photon sources from semiconductor quantum dot structures. Michler et al in "A Quantum Dot Single—Photon Turnstile Device" Science 290 p 2282 to 2284 (2000) and Santori et al "Triggered Single Photons from a Quantum Dot" Physical Review Letters 86 p 1502 to 1505 (2001) also describe single photon sources which operate by optically pumping a single quantum dot. These devices require optical excitation of carriers into the quantum dot using an external laser source. As such the devices are cumbersome and expensive.

Electrically injected single photon emitters have been proposed by J. Kim et al in Nature, 397, p 500 (1999) based upon an etched quantum dot structure. However, the method described of forming the quantum dot by etching, produces a large number of non-radiative centres, which drastically reduces the emission efficiency of the device and leads to many of the injected electron-hole pairs being lost through non-radiative recombination. Furthermore it is difficult to produce small quantum dots using this method, thus confining the operation of the device to very low temperatures.

An electrically injected single photon emission device has also been proposed in a theoretical paper by Benson et al, Physical Review Letters 84 p2513–2516 (2000) based upon etching a very small mesa or pillar on a p-i-n layer structure so as to contain a single quantum dot in the intrinsic region. The disadvantage of this device is that isolating a single quantum dot using this method necessitates etching a pillar with very small surface area. This again introduces non-radiative centres at the etched surface which for small pillars would reduce the emission efficiency of the device. Furthermore, it is difficult, if not impossible to make electrical contact to the pillar.

It is an object of the present invention to address the above problems, by providing a photon source with high emission efficiency to which easy electrical contact can be made.

Thus, in a first aspect, the present invention provides a photon source comprising: a photon source body, said photon source body comprising a plurality of quantum dots and at least one electrical contact, configured to allow electrically activated emission of radiation from at least one of the quantum dots, the photon source further comprising means for defining an active region within said photon source body such that emission is only collected from a dot or a limited number of dots within said active region.

The active region will have just one quantum dot or a small number of quantum dots. As it is very difficult to fabricate a device where all the quantum dots are of the same size, it should be possible to distinguish between the output of each of the small number of quantum dots in the active region since each dot will emit photons having a slightly different energy. The active region will preferably have a cross sectional area from 0.01 to 4 $\mu m^2$. Typically, the dots will be formed in a layer or a plurality of layers which preferably extend over an area from 20 to 100 $\mu m^2$. The cross sectional area of the active region being measured in the plane of the layer or layers.

By defining an active region within the body of the photon source, the body of the photon source may be made large enough to ensure that it can be reliably electrically contacted while still allowing emission from a single quantum dot to be selected.

The active region may be defined in terms of a limited collection region, wherein only photons emitted from dots within the active region will be collected and emissions which may occur from other dots will either be blocked or will not be allowed to contribute to the output of the source.

The photon source may further comprise an emission member having a body with an aperture, said aperture being positioned such that emission from dots in the active area is transmitted through said aperture. The emission member may be provided remote from the photon source body or preferably provided adjacent said photon source body.

For example, the emission member may be a collection optic such as fibre-optic cable or lens which is positioned such that it only collects photons emitted from dots within a certain region of the device, the so-called active region. The active region being defined by the position and size of the aperture.

Alternatively, the emission member may be mask or the like which is provided with an aperture, the mask being positioned such that only photons emitted from dots in the active region are transmitted through the aperture, wherein radiation from the other dots is absorbed or reflected by said mask.

The emission member may also be integral with the photon source body. For example, the emission member may be a layer or a plurality of layers within the body of the source. The emission member may even be provided by a layer which has some other function. For example, the electrical contact may shaped to also act as the emission member.

There may be more than one emission member, allowing a number of alternative outputs from the device.

In a further arrangement, the active area may be defined by ion beam damage, such that the lattice surrounding the quantum dots in regions outside the active region is damaged. This results in non-radiative recombination for excitons in the damaged quantum dots, suppressing light emission from them. The consequence is that only the undamaged dots are optically active, and thus emission from a single dot, or small number of dots, can be isolated.

The photon source may also be configured such that only carriers in the active region may be electrically activated. For example, generally, an injection means will be provided in the form of a current injection region which has a plurality of excess carriers for injecting into said quantum dots. This current injection region may be reduced in size so that it only injects carriers into the active region. To achieve this, the current injection area may be etched to reduce its size so that it can only inject into a limited number of dots or a single dot.

In a further example, a current blocking member is provided which will only allow carriers to enter the active region. Such a current blocking member may be provided by a layer of insulating material with a conducting aperture. For example, a layer or a part of a conductive layer may be rendered insulating by oxidation, ion beam damage or the like.

The photon source body may comprise a p-i-n structure, where the quantum dots are provided in an intrinsic region located between a p-type current injection region and an n-type current injection region. When the active region is defined by configuring the body of the source such that only dots in the active region are electrically activated, it is only necessary for the source to be configured such that just one of the n-type or p-type injection regions injects carriers into just the active region because a quantum dot must trap both an electron and a hole before it can emit a photon.

The preferred intrinsic region thickness is from 0.1 $\mu$m to 0.4 $\mu$m, more preferably 0.1 $\mu$m to 0.3 $\mu$m. These parameters allow high frequency modulation.

In operation, electrons and holes travel across the active region, due to an electrical signal applied by the electrical contact, the quantum dot traps an electron and hole. Radiative recombination of the electron and hole occurs on the timescale of the radiative lifetime. Once the photon is emitted, the dot then traps a further electron-hole pair and the process is repeated.

At low injection currents, an optically active quantum dot will usually capture no more than a single electron and a single hole. The single electron and single hole form a simple exciton within the dot. When the electron recombines with the hole, it emits a single photon. The output spectrum of the quantum dot thus consists of a single line due to the simple exciton transition.

At higher injection currents, it is possible to inject more than one electron and/or hole into the quantum dot, creating a more complex exciton state in the dot. Recombination of one of the electrons with one of the holes, leaving behind the other carriers in the dot, again results in the emission of a single photon. However, this photon has a slightly different energy than that emitted by the simple exciton, due to the Coulomb interaction of the extra carriers with the recombining electron-hole pair. Thus the emission by different exciton complexes (i.e. combinations of different numbers of electrons and holes) can be spectrally distinguished. Each exciton complex produces a distinct line in the emission spectrum at high current injection.

When equal numbers of electrons and holes are injected into the dot, a neutral exciton complex is formed, the simplest of which is the simple exciton of one electron and one hole. The biexciton state is formed when there are two electron and two holes trapped in the dot. A dot containing three electrons and three holes forms a tri-exciton state etc. There can also be an imbalance in the number of electrons and holes trapped in the dots leading to the formation of negatively charged or positively charged excitons.

The higher order transitions of the quantum dot have been found to be beneficial for single photon emission. In particular the biexciton state has been found to have a shorter radiative lifetime than the simple exciton and thus there will be reduced jitter between emission times of biexciton photons.

Charged excitons, for which there is an imbalance in the number of electrons and holes trapped in the dots, also display a shorter radiative lifetime than the simple exciton, and thus are also advantageous compared to the simple exciton. Charged excitons can be formed, for example, if remote doping near dots was incorporated in the diode structure.

The photon source can also be configured to generate photons from more than one of the exciton complexes.

At the drive currents where the dot is injected on average with two electrons and two holes, the quantum dot will emit two photons; one at the biexciton transition energy and the other at the simple exciton transition energy. As described above, the two photons have different energies because of the Coulomb interaction of the second electron-hole pair with the first. The fact that the exciton and biexciton photon have different energy allows them to be separated using a dichroic mirror or spectrally selecting element and measured at separate locations.

The dot may also produce pairs of photons whose linear polarisation states, phase states or other properties may be entangled.

Entanglement of the polarisation states of the two photons can be regarded as ambiguity in the polarisation state of either the exciton or biexciton photon. The first photon emitted by the biexciton state (i.e. the biexciton photon) could be emitted in either of the two orthogonal polarisation states $\sigma-$ or $\sigma+$. Provided that there is no scattering of the spin state of the exciton within the dot after this emission event, the second photon will be emitted in the opposite polarisation state, as described by Benson et al. The two photon wavefunction must therefore be represented by the maximally entangled state $$\phi=2^{-1/2}(|\sigma^->_1|\sigma^+>_2+|\sigma^+>_1|\sigma^->_2)$$

where the subscripts refer to the first (1) and second (2) emitted photons.

In other words, a measurement of the state of one of the photons will directly affect the state measured on the other photon of the entangled photon pair, which as has been discussed in the introduction has applications in quantum information technology.

It is possible to configure the device so that photons are emitted from a single quantum dot on demand. This can be achieved using a pulsed bias applied to the photon source, the bias switching between a first level where carriers are not injected into quantum dots and a second level where carriers may be injected into quantum dots. The period of the pulse signal determines the period between photon emissions. The length of time when the bias is at the second level should be less than the radiative lifetime of the relevant electron-hole recombination process to ensure that just one photon is emitted during each pulse.

In the above mode of operation, the pulsed bias switches the device between a level where no current can flow and a level where a diffusion current flows.

However, it is also possible to operate the device so that the pulsed bias switches the device between various resonant tunnelling conditions. For example, electrons can be injected directly into a vacant conduction band level of a quantum dot and/or holes can be directly injected into a vacant valence band level of the same quantum dot. Alternatively, one or both of the carriers may be injected into the quantum dots by resonantly tunnelling through a double barrier structure. Such a structure provides a good peak-to-valley characteristics for the injection current.

Using these techniques, the length of time that the bias is at a particular level is not important, only the speed at which the bias can be switched from one level to another.

For example, the source may be operated so that at $V_1$ electrons are injected into the quantum dots and at a second voltage, $V_2$, holes are injected into the quantum dots. Once an electron is injected into the quantum dots, the energy levels within the quantum dot change so that it is not possible to inject a further electron into the quantum dot until the first electron has recombined. Similarly, once the highest level changes to introduce a hole into the quantum dot, only one hole can be inserted into the quantum dot. Once the electron and hole recombine, there is no danger of a further electron hole pair being immediately excited because only holes can be added to the quantum dot until the bias level falls again to level $V_1$. The device can be designed so that $V_1$ is $>V_2$ or so that $V_1$ is $<V_2$.

Alternatively, the device may also be configured so that there is a single bias level at which both a single electron and a single hole tunnel into a particular quantum dot. Biases $V_1$ and $V_2$ can be set to just above and below this level so that sweeping the bias between these two levels causes the emission of photons from the quantum dot.

The device may also be operated so that just one electron or one hole is resonantly injected, the other carrier reaching the dot by diffusion. Alternatively, the device may be configured so that carriers of one conductivity type, for example, hole are constantly provided to the dots and the other carrier, in this example electrons, are resonantly injected into the dots.

A device of this type will generally have dots of differing sizes. Therefore, these dots will have a variation in their equivalent energy levels and hence by careful selection of the energy of the carriers, it is possible to only inject into a dot or a small number of dots using carriers having a particular energy. Possibly, just one single dot will have an energy level which will align with the energy of the injected carriers. Thus, this use of resonant tunnelling to operate the device provides another way of limiting the dots which contribute to the eventual output of the device. It can be thought of as a means for "spectrally injecting" carriers into the dots.

A double barrier structure has been mentioned above. In this structure, in order for carriers to tunnel through the structure, they must be injected into the double barrier structure with an energy which aligns with that of a confined energy state located between the two barriers of the double barrier structure. Carriers which tunnel through this barrier structure then diffuse into the quantum dots. This device operates in much the same way as a p-n junction. However, due to the resonant tunnelling characteristics of the double barrier structure, the current voltage characteristics of such a structure are substantially enhanced. Specifically, as the energy of the injected carriers rises, the current through the structure remains almost at zero. Once the energy of the injected carriers reaches that of a confined energy level located between the two barriers, resonant tunnelling occurs and there is a very sharp peak in the current. Once the energy of the carriers is raised beyond this level, the current returns to zero. This sharp peak allows a sudden boost of carriers to be supplied to the dots. However, the sudden burst of carriers can be achieved by switching the device at a relatively slow rate.

In order to remove photons from the output of the source which arise due to other unwanted radiative transitions within the body of the photon source, the photon source preferably comprises spectral filtering means configured to only pass photons having the desired wavelength.

Typically, emission from just one quantum dot will be collected. If other dots are emitting in the active region, photons from these dots may be filtered out since there will be a variation in the size of the quantum dots, and hence a variation in energy of the outputted photons.

Also, as described above, a single quantum dot may emit photons of differing energies depending on the exciton formed in the quantum dot.

In addition to photons arising from transitions within the quantum dot, there is likely to be spurious emission from other parts of the photon source. This may also be blocked by the filtering means.

The filtering means may also be configured to pass emission from a plurality of quantum dots. For example, these dots may emit at different wavelengths and thus the filter means can be designed to allow more than one wavelength to pass, either through a widened bandpass or through multiple, distinct bandpasses. This could be used to form a wavelength multiplexed photon source.

The filter means may comprise a spectrometer such as a grating or prism spectrometer. Alternatively an interference filter can be used. The filtering component may also be a fibre optic device. If a single dot transition is selected, ideally the bandpass of the filter is matched to the spectral width of the transition.

The filter means may also be integral with the photon source body, for example, the filter means may be provided by a diffraction grating provided on said source body, or an interference filter provided on said source body.

The filter means may also be tuneable in wavelength and thus can allow different quantum dots within the source to be utilised.

The filter means need not necessarily be incorporated with the device or close to the photon source body. It could also be provided in a transmission system or even in a detection system.

The source may be operated as a photon pair source. For this operation, the filtering means is configured to pass photons having either the energy of the single exciton emission or the energy of the bi-exciton emission. Photons having one of the said energies may be directed along a first trajectory and photons having the other of said energies along a second trajectory. The first and second trajectories are spatially distinct to allow the photons to be directed into different optical transmission systems which may be provided by lenses, fibre optic cables or the like.

In a variation on the above apparatus, the means for directing photons having the different energies may be provided separately from the filtering means. These directing means may be provided by a dichoric mirror or the like.

In a further variation, on the photon pair source, the output from the photon source body is separated by a separating means which can distinguish between the two photons of a pair, and then one photon is directed into a first filter means and the other photon is directed into a second filter means.

For example, the separating means may be a dichoric mirror or the like, configured to direct photons having less than a predefined energy into the first filter means and photons having an energy larger than the predefined energy into the second filter means, where the predefined energy lies between that of a photon emitted due to single exciton decay and a photon emitted from biexciton decay. Also, since a single quantum dot will emit a photon due to biexciton decay before it emits a photon due to single exciton decay, the separating means may direct photons which arrive at one time into one of the filter means and at another time into the other of the filtering means. The filter means then filter out photons due to radiative transitions in other dots or elsewhere in the photon source body.

In order to provide high collection efficiency from the photon source, the active region is preferably provided within an optical cavity.

The advantage of using a cavity is that it allows more of the emitted light to be coupled into the numerical aperture of a collecting fibre or optic. The cavity mode of the resonant cavity is emitted into a narrow range of angles around the normal to the mirrors that define the cavity. The fibre/collection optic may be arranged to collect the cavity mode.

If the quantum dots are provided in a layer or plurality of layers, the optical cavity may be provided by reflecting regions on either side of said dot layer.

Preferably, one of the reflecting regions (ideally the reflecting region closest the output surface of the body) is less reflective such that it can transmit the emitted photons. More preferably, the energy of the cavity mode for said cavity is substantially equal to that of the desired emitted photons.

Further, it is preferable if the distance between the two reflecting regions $L_{cav}$ of the cavity is defined by $$L_{cav} = \frac{m\lambda}{2n_{cav}}$$

where m is an integer, $n_{cav}$ is the average refractive index of the cavity and $\lambda$ is the emission wavelength (in vacuum) of the desired photons.

At least one of the reflecting regions may be Bragg mirror comprising a plurality of alternating layers where each layer satisfies the relation:

$$n_a\, t_a = n_b\, t_b = \lambda/4$$

where one dielectric layer (a) has a refractive index of $n_a$ and a thickness of $t_a$ and second dielectric layer (b) has a refractive index of $n_b$ and a thickness of $t_b$.

The Bragg mirrors may be grown in-situ with the semiconductor layer structure, or be formed afterward using semiconductor or dielectric layers (e.g. $TiO_2/SiO_2$).

The Bragg mirrors may be formed by alternating layers such as $GaAs/AlOx$, $GaAs/AlAs$, $TiO_2/SiO_2$, $Al_xGa_{1-x}As_ySb_{1-y}/AlAs_ySb_{1-y}$ (where y=0.5 and x=0.1), InP/InGaAsP, $InP/In_{0.52}Al_{0.48}As$, InP/InAlOx. GaAs/AlOx or InP/InAlOx are particularly preferable because of the large refractive index contrast between AlOx and GaAs or InP and InAlOx. (AlOx refers to the family of Aluminium Oxides.) This means that fewer layer repeats are required to produce a high reflectivity mirror. Preferably, the alternating stack will comprise from 2 to 50 periods, more preferably from 2 to 20 periods.

At least one of the mirrors may also comprise a metal layer, such as Gold, Silver or Aluminium. The metal layer may be formed during the epitaxial growth of the semiconductor layers or in a separate step. A phase matching layer may also be located between the cavity and the metal layer, so that an anti-node is produced in the cavity mode at the interface between the cavity region and the phase matching layer. The metal layer may be configured as the above described emission member.

At least one of the mirrors may even be a semiconductor/air or semiconductor/dielectric interface.

If a plurality of quantum dots are provided in the active region, the cavity is preferably designed so that one or predefined number of the quantum dots has an emission energy, which couples to the cavity mode. This can be used to ensure that emission from only one dot is collected, which is important for ensuring single photon emission. The energy of the cavity mode is controlled largely by the optical thickness of the cavity region.

In this case, the energy width or band-pass of the cavity mode should be approximately equal to, or slightly larger than, the line width of the emission arising from the desired transition from quantum dot. This can be achieved by configuring the design of the cavity as required—in particular the reflectivity of the cavity mirrors. The spectral width of the cavity mode decreases with increasing mirror reflectivity. The reflectivity of a Bragg mirror can be enhanced by increasing the number of periods in the mirror.

The active region may be provided in a three dimensional cavity, such a three dimensional cavity may be produced by a three dimensional variation in the dielectric constant around the quantum dot.

Such a structure may be achieved by a photonic band gap structure within the plane of the layers of a one dimensional cavity to provide confinement in the plane of the layer or layers.

The photonic band gap structure is preferably provided by a plurality of reflective surfaces provided in the plane of said quantum dot layer, the active region being provided at an irregularity in the pattern. The emitted radiation is then emitted in a narrow cone centred about the normal to the plane of the layers and about the irregularity in the pattern.

The pattern of interfaces may take a number of forms. For example, the pattern may be provided on a triangular, rectangular or hexagonal lattice.

These reflective surfaces may be provided by a pattern of holes which extend through said dot layer and the active region being provided at an irregularity in said pattern. The holes may be produced by etching. As the active region is not defined by the holes, the holes may be kept well away from the boundary of the active region and hence any non-radiative centres produced by the etch will not detriment to the performance of the source.

The holes may be empty or filled with a suitable dielectric material. Alternatively, the reflective surfaces could be provided by a plurality of columns formed in the dot layer. The holes or columns are preferably circular in the cross-section. However, rectangular cross-sections or other shapes could also be used. The pattern could also be a series of concentric rings, the 3D cavity being formed at the centre. The period measured along a radius being constant except at the centre.

Generally, it is desirable to generate photons with a wavelength of either 1.3 µm or 1.55 µm as both of these wavelengths are commonly used for fibre optic cables. For a triangular lattice, the holes separation would be in the range 200–2000 nm and the size of the holes would be chosen to remove 20–80% of the surface area. The structure can also be designed to operate at other wavelengths.

The photon source may be configured so that the light is emitted normal to the plane of the layers. However, the device may also be configured such that the light is emitted in the plane of the layer or layers. This can be achieved by reducing the number of repeats of the pattern in the direction in the plane along which light emission is required. The device can be cleaved to provide an output face normal to the described emission direction. Alternatively, a second irregularity can be introduced into the pattern to guide the light away from the first irregularity.

As the cavity is used to enhance emission at a particular wavelength, the cavity may also act as the above described filter means.

The active region may also be defined by configuring the device such that the dots in the active region have a faster radiative recombination rate than the dots outside the active region. Alternatively, the device may be configured so that the dots outside the active region have a higher non-radiative recombination rate than those inside the active region. There is a competition between the radiative and non-radiative recombination in a quantum dot.

Exciton recombination in dots with a higher radiative recombination rate will be dominated by photon emission leading to a bright line in the emission spectra. Excitons in dots with a fast non-radiative recombination rate will predominantly decay without photon emission and their contribution to the output of the device will be weak. Thus, if the dots in the active region has a higher radiative recombination rate than those outside the active region, then radiation from the dots in the active region will dominate the output of the device. Similarly, the same is true if the dots outside the active region have a higher non-radiative recombination rate. Thus, by controlling these two rates, it is possible to suppress the intensity of emission from some dots relative to others and hence select a single dot or a limited number of dots.

This variation in the recombination rates between the quantum dots can be achieved by use of an optical cavity. Quantum dots located within the optical cavity will have a higher radiative recombination rate than those outside the cavity. To enhance this effect further, it is preferable if the dots in the active region are provided at an antinode of the cavity whereas the dots which are not in the active region are provided at a node in the optical cavity. The device may be configured to produce this effect by configuring the position of the reflecting regions and dots as desired.

In a second aspect, the present invention provides a method of operating a photon source, the photon source comprising a plurality of quantum dots and a contact configured to allow electrically activated emission from a plurality of said quantum dots, the method comprising:

applying an electrical signal to said contact to allow electrically activated emission from said plurality of quantum dots; and providing an emitting means configured to only allow emission from a limited number of said plurality of quantum dots to be emitted from the source.

In a third aspect, the present invention provides a method of forming a photon source, the method comprising:

forming a plurality of quantum dots;

forming an electrical contact which is configured to allow electrically activated emission from a plurality of quantum dots; and forming an emission member configured to allow emission to be collected from a limited number of dots.

In a fourth aspect, the present invention provides a method of forming a photon source, the method comprising:

forming a plurality of quantum dots;

forming an injection region which is configured to allow electrically activated emission from a plurality of quantum dots;

forming an electrical contact to said injection region; and forming an insulating mask to allow electrical injection to only a limited number of said dots.

The insulating mask may be formed by growing an insulating layer between the quantum dots and the injection region. Alternatively, it may be formed by oxidising or implanting ions into a further layer located between the injection region and dots.

In a fifth aspect, the present invention provides a method of forming a photon source, the method comprising:

forming a plurality of quantum dots;

forming an injection region which is configured to allow electrically activated emission from a limited number of said quantum dots;

forming an electrical contact to said injection region.

The injection region may be etched, oxidised or damaged such that it can only electrically activate a limited number of dots.

In any of the above aspects relating to the formation of a photon source, the quantum dots are preferably formed using the Stranskii Krastonow technique.

As previously mentioned, it is possible to isolate emission from a single quantum dot using either spectral filtering means such that emission is collected from either a single dot or a plurality of quantum dots, limiting the number of dots by limiting the number of dots from which emission is collected on the basis of the position of the quantum dots within the photon source body.

Thus, in a sixth aspect, the present invention provides a photon source comprising:

a photon source body, said photon source body comprising a plurality of quantum dots and at least one electrical contact, configured to allow electrically activated emission of radiation from at least one of the quantum dots, the photon source further comprising limiting means for limiting the number of dots which contribute to the output of the source.

Preferably, said limiting means limits the number of dots such that only one dot contributes to the output of the source.

The limiting means may comprise means to spectrally filter the output of the quantum dots or it may be configured to limit the number of dots from which emission is collected on the basis of their position within the body.

The limiting means may also be configured such that carriers are only injected into a limited number of dots. This may be achieved by providing a variation in the size of the quantum dots and injecting the carriers with an energy such that they can only populate certain dots. For example, the source body may be configured such that carriers resonantly tunnel into the quantum dots.

The limiting means may be integral with the body of the source. For example, the limiting means may be provided by an optical cavity.

The dots may be provided in a layer or a plurality of layers within the body. In this configuration, the body may be configured to emit radiation substantially perpendicular to the plane of the layers, the emitted radiation being directed into said limiting means. Alternatively, the body may be configured to emit radiation substantially parallel to the plane of the layers, said emitted radiation being directed into said limiting means.

The present invention will now be described with reference to the following non-limiting embodiments in which.

Figure 20:
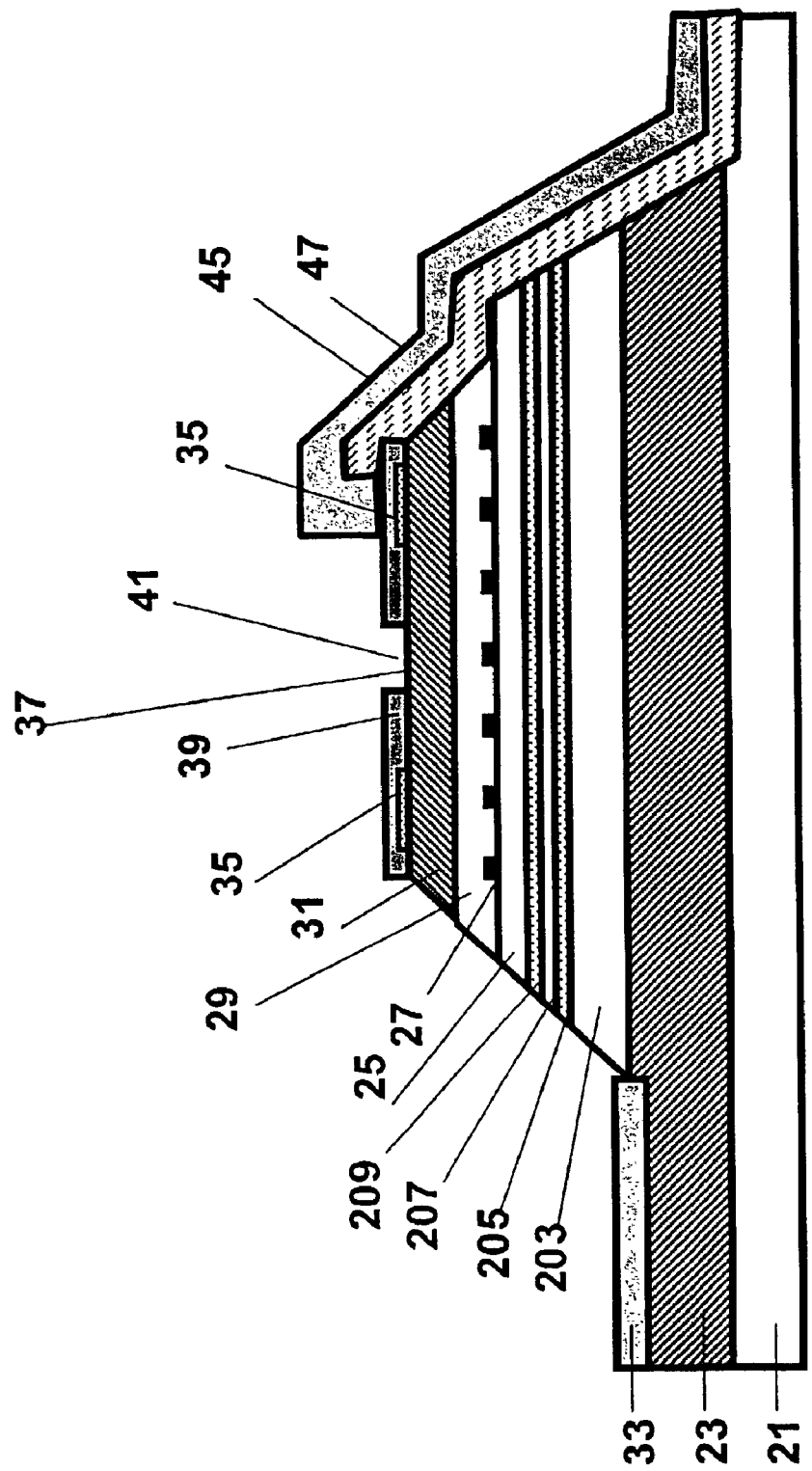
FIG. 20 illustrates a device in accordance with an eleventh embodiment of the present invention, where carriers are injected into the quantum dots by configuring part of the device as a resonant tunnelling diode.
Figure 21:
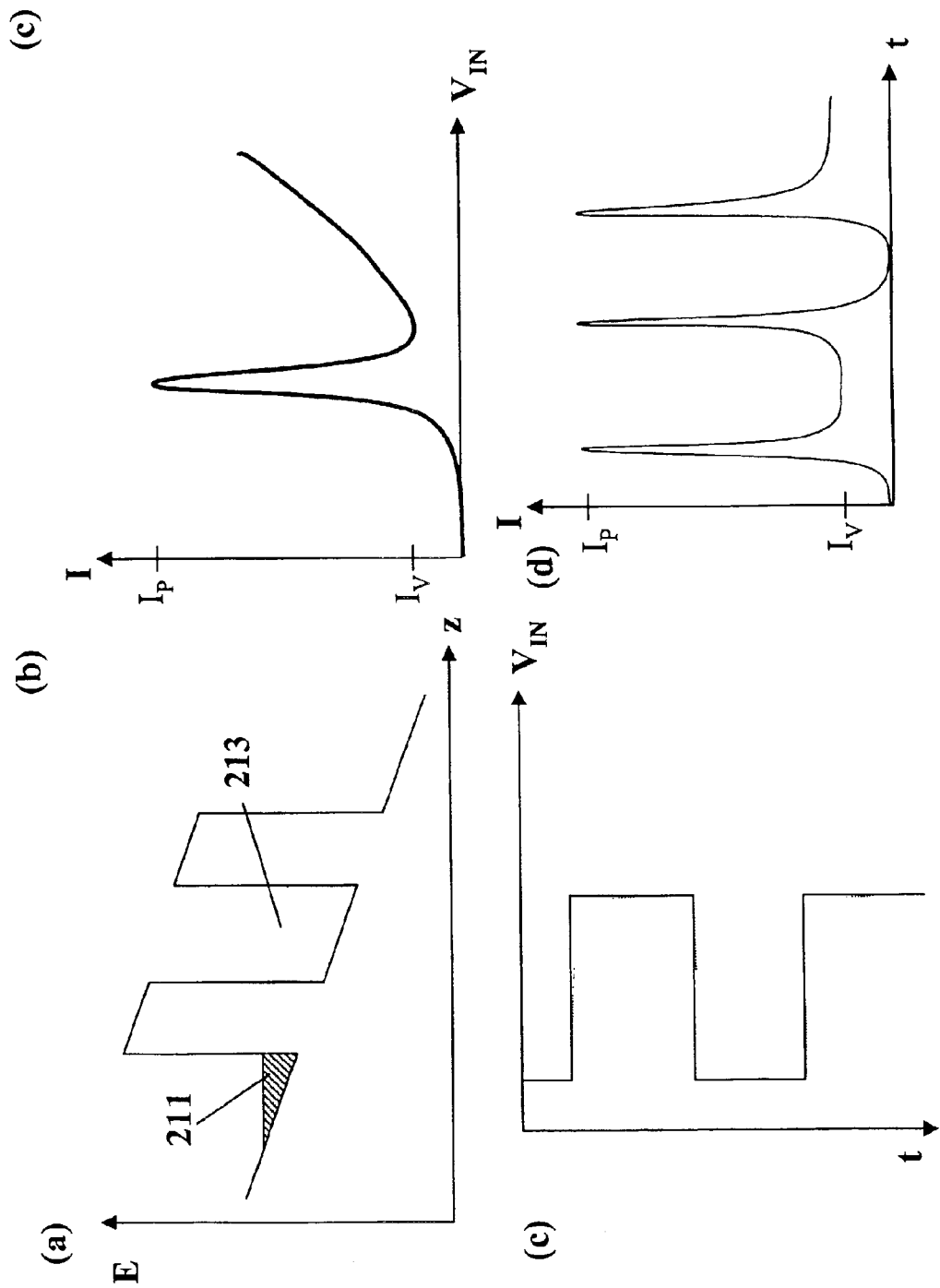
Figure 22:
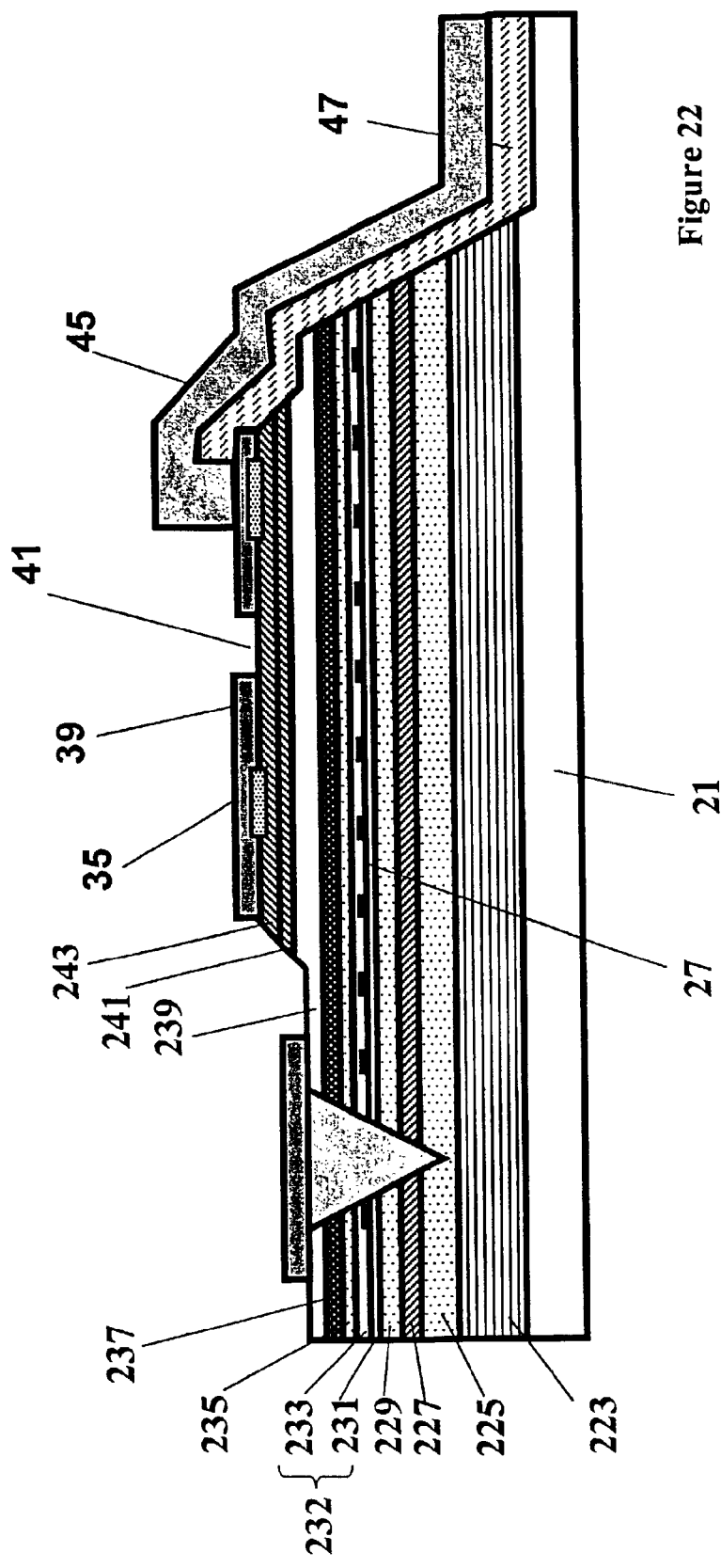
Figure 23:
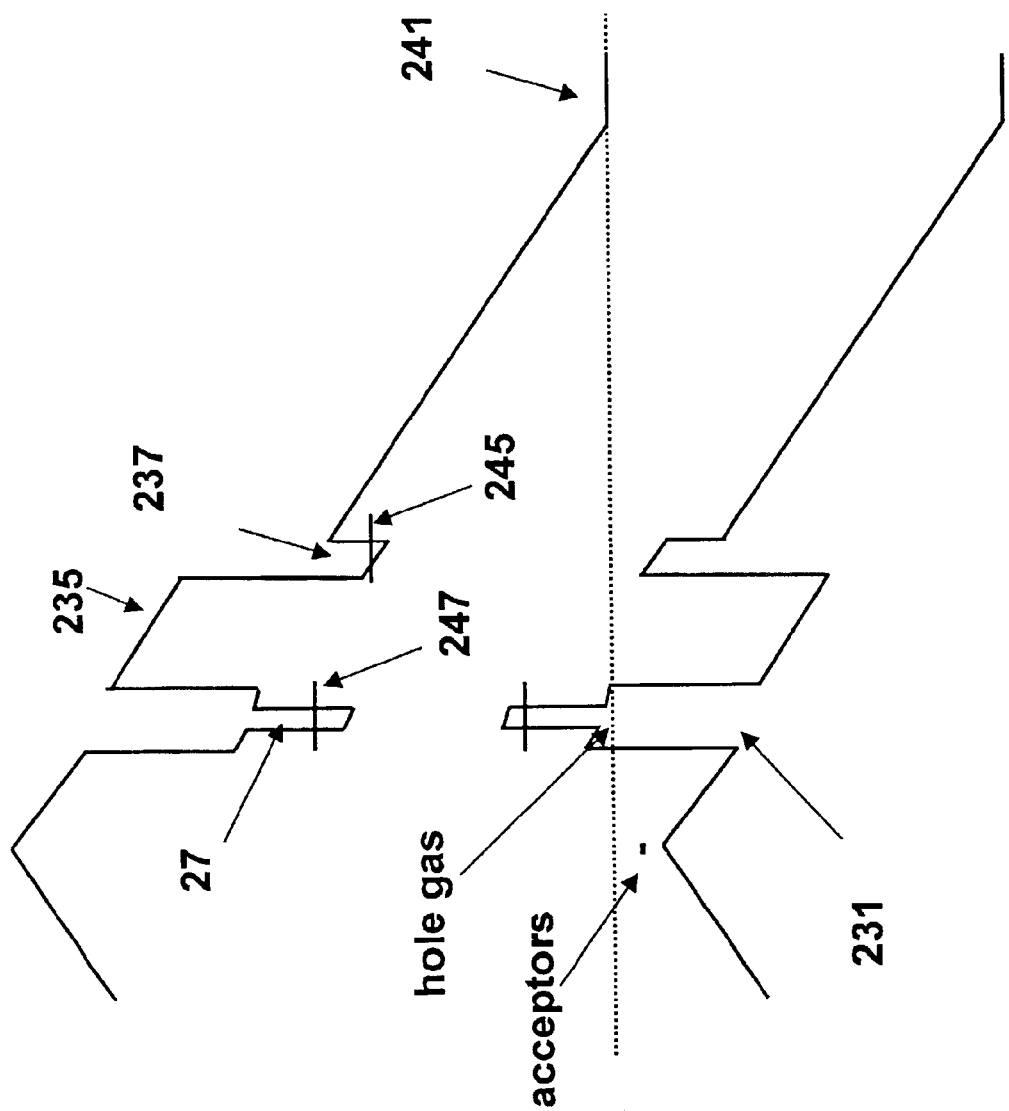
Figure 24:
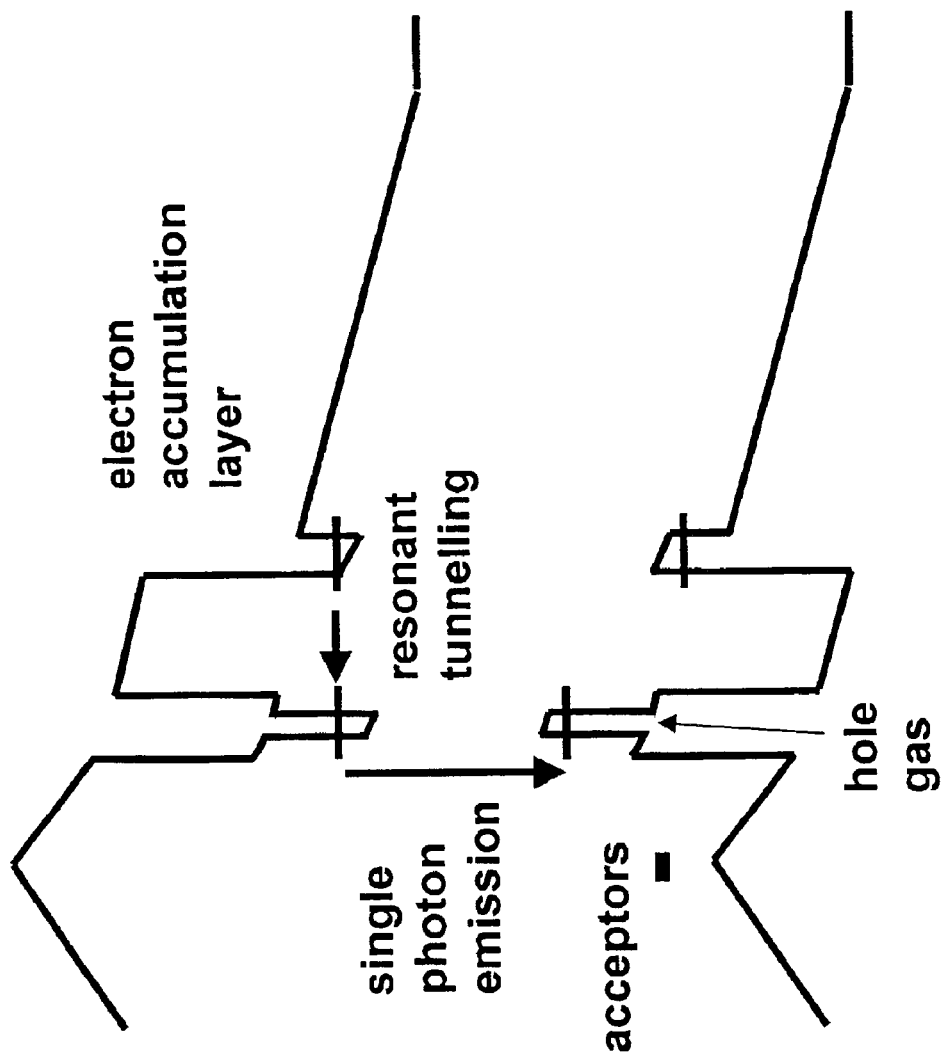
Figure 25:
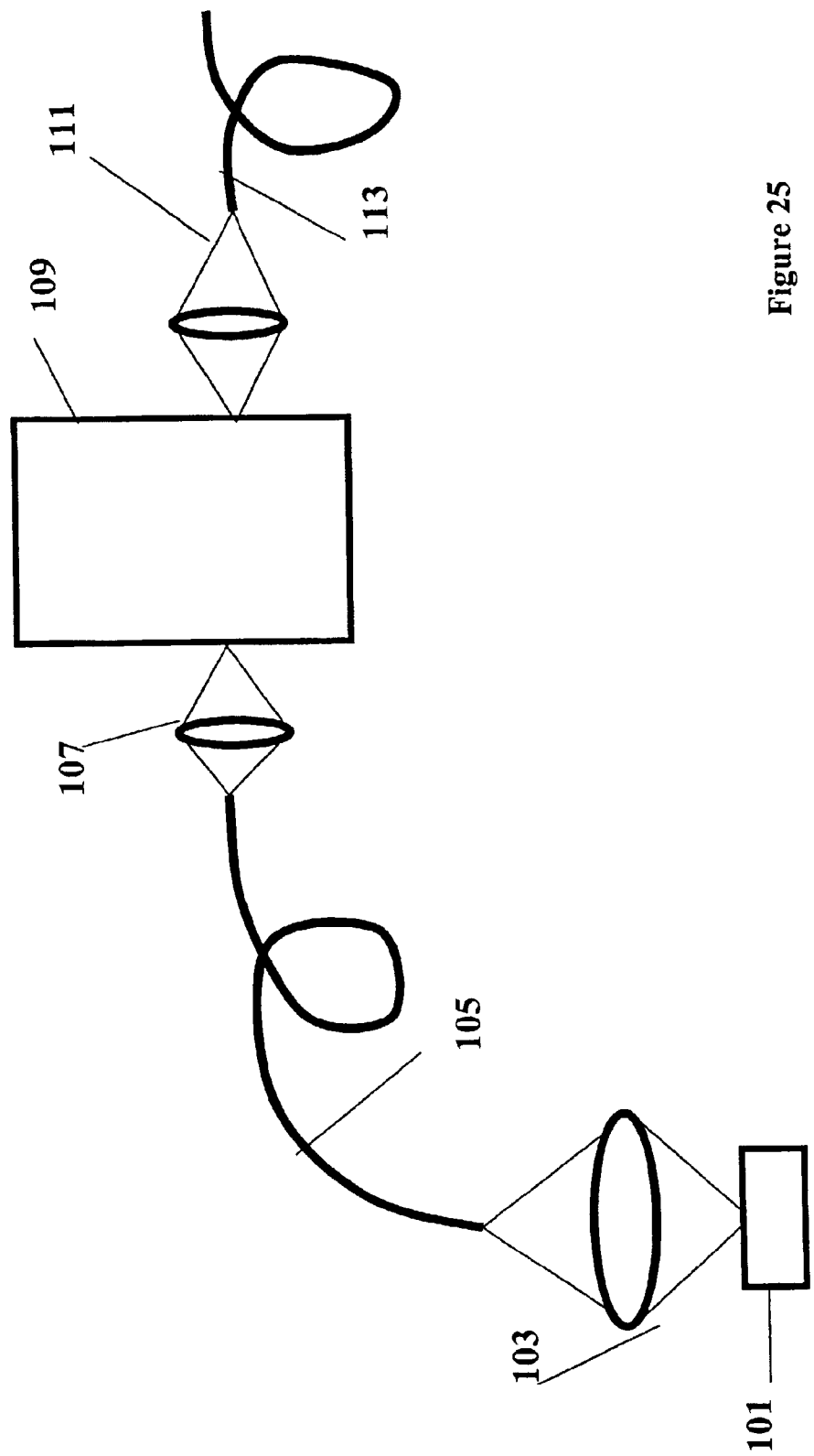
Figure 26:
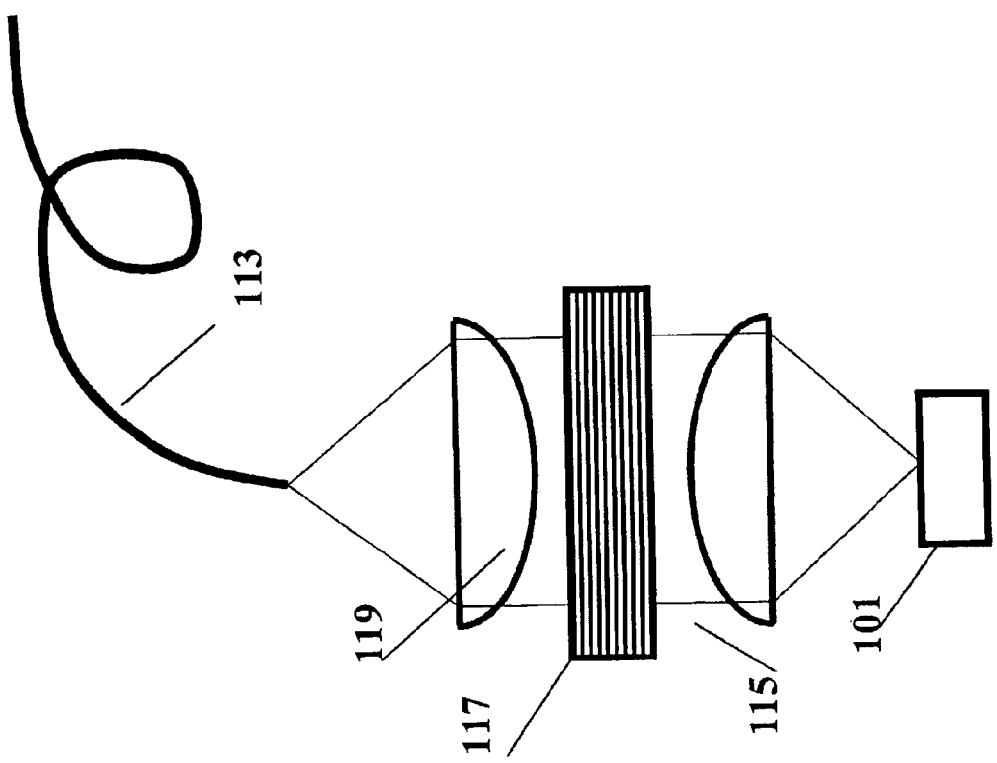
Figure 27:
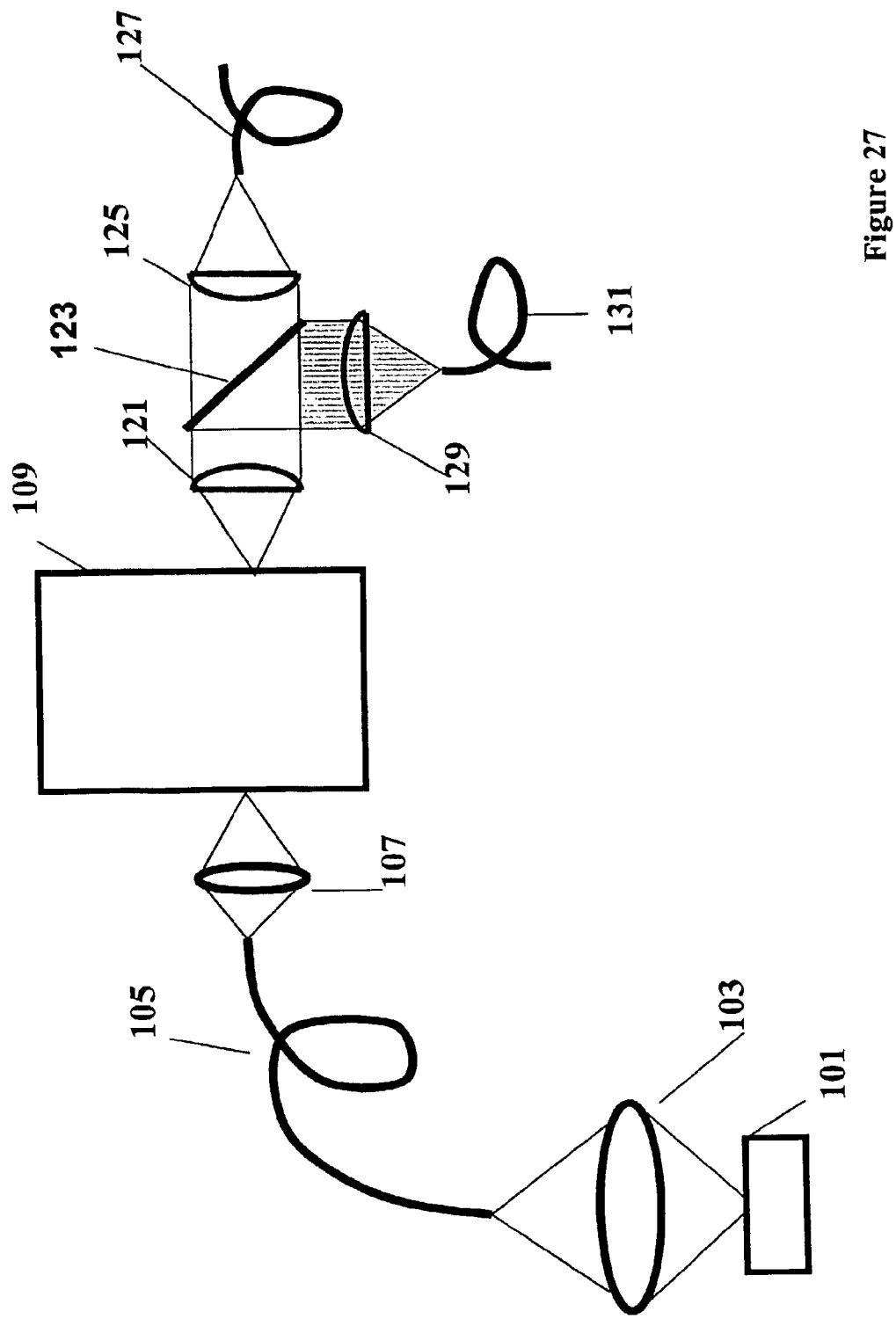
Figure 28:
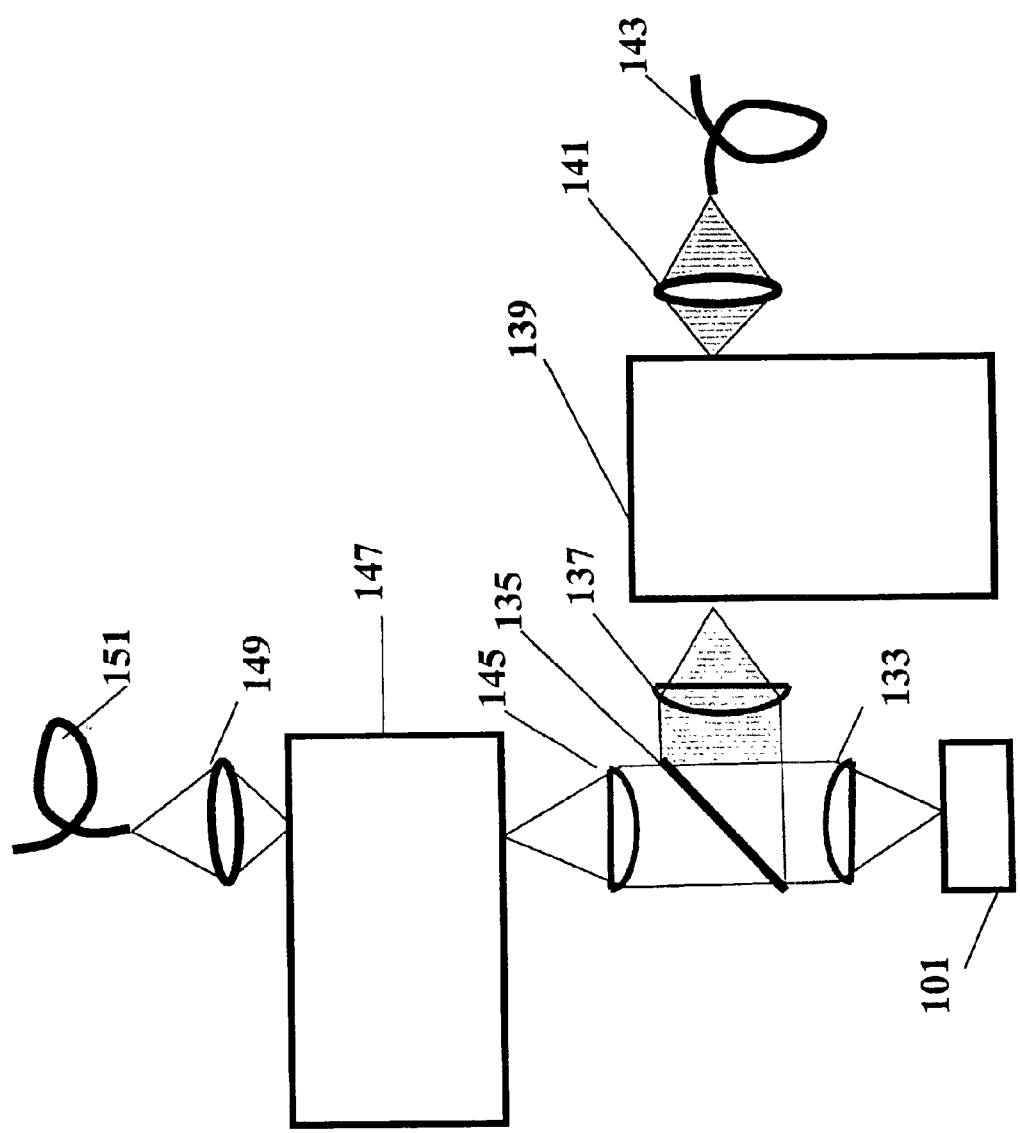
Figure 29:
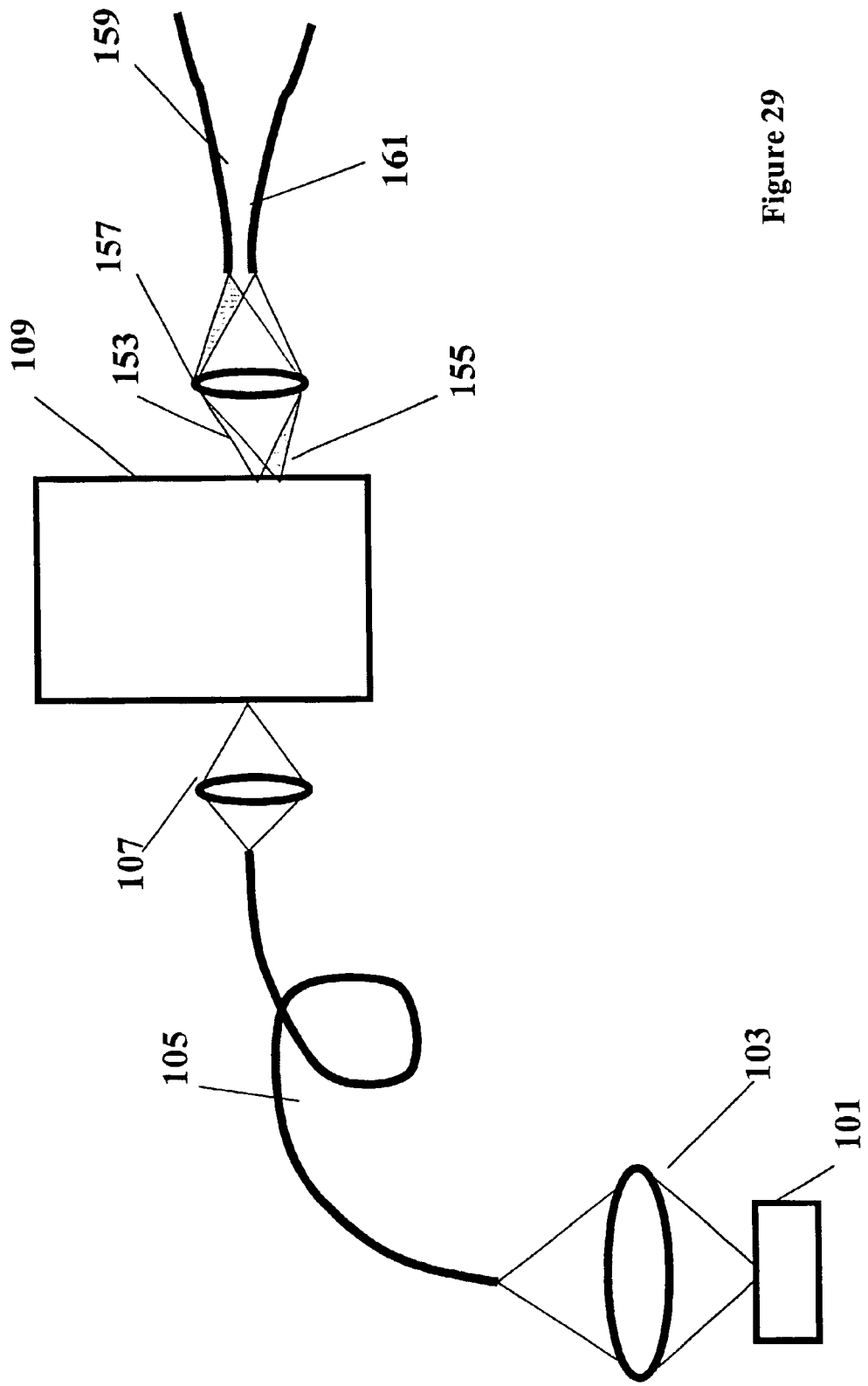
Figure 30:
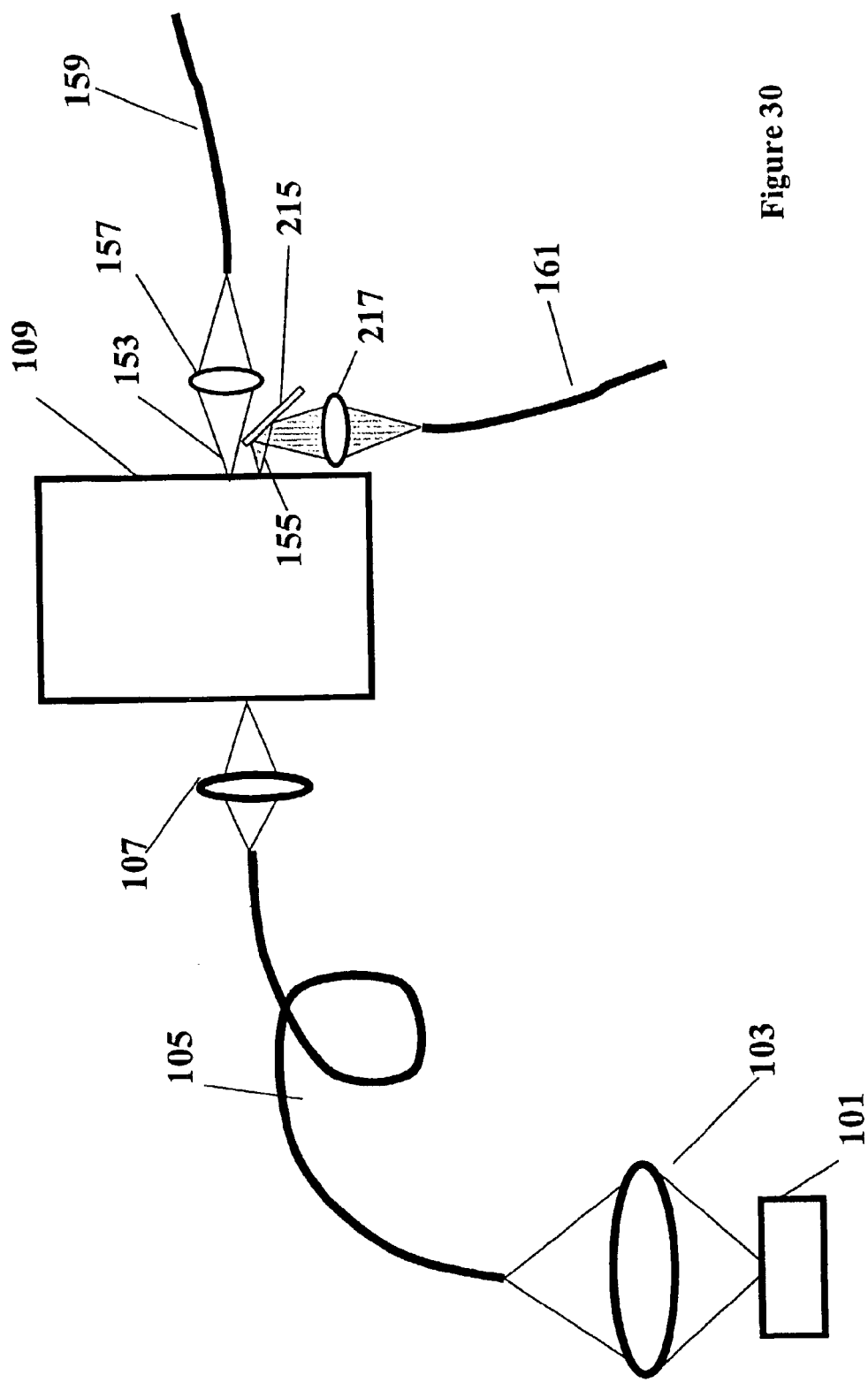
Figure 31:
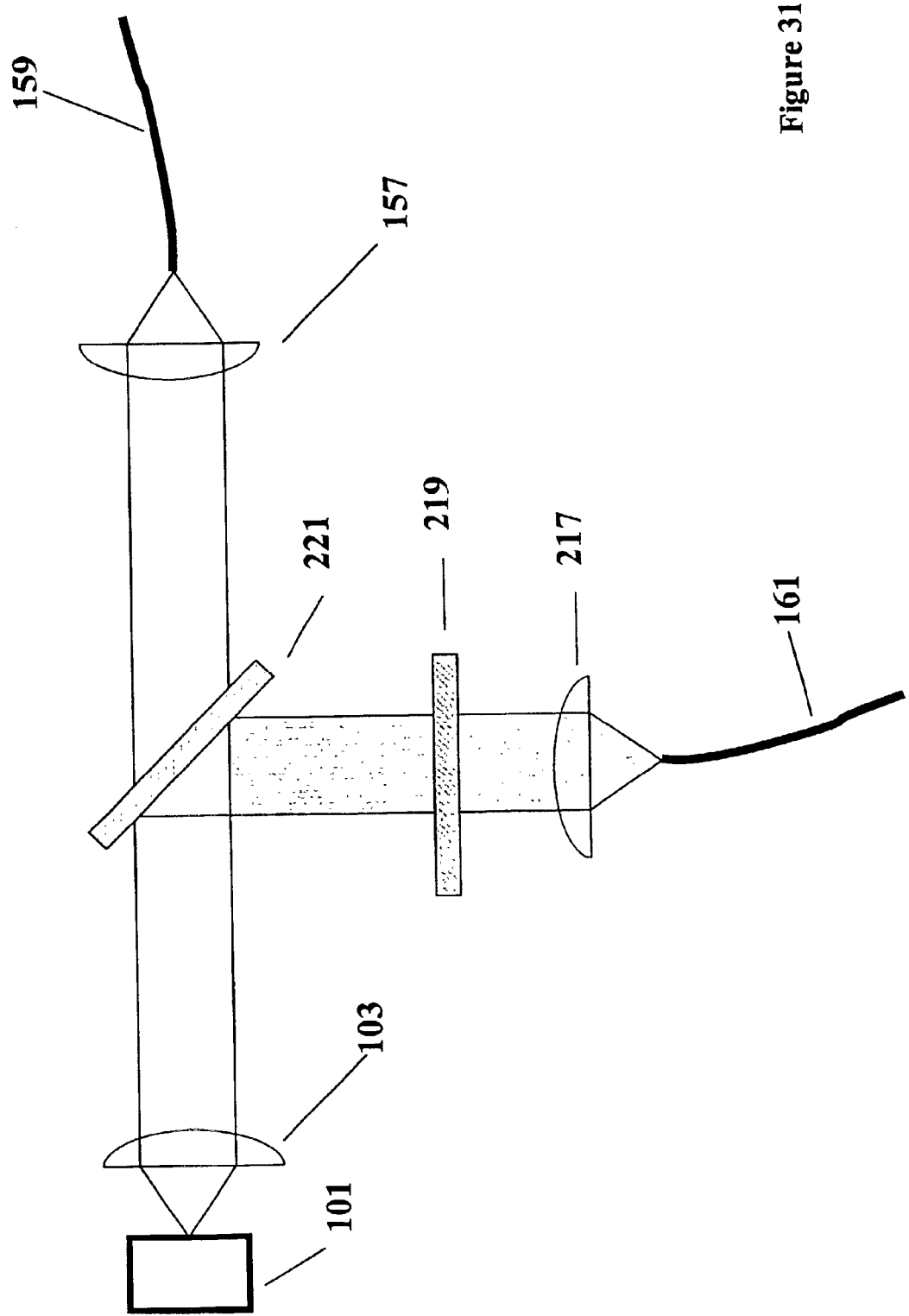

FIG. 21a is a schematic of the conduction band structure of a resonant tunnelling device (RTD) of the type which can be used in the device of FIG. 20; FIG. 21b is a plot of the output current against applied voltage an RTD of the type schematically illustrated in FIG. 21a; FIG. 21c is a plot of voltage across the RTD against time when the current is swept back and forth as a function of time; FIG. 21d is a plot of current against time for the RTD when the voltage is swept back and forth over the voltage range illustrated in FIG. 21b;

FIG. 22 illustrates a device in accordance with a further embodiment using a resonant tunnelling structure;

FIG. 23 shows the band profile of the device of FIG. 22 biased voltage is such that electron injection into the dots is suppressed;

FIG. 24 shows the band profile of the device of FIG. 22 biased such that electrons are injected into the dots; of under voltage conditions that allow resonant electron injection into the device of FIG. 22;

FIG. 25 illustrates an experimental arrangement for collecting light emitted from a source in accordance with any of the above embodiments;

FIG. 26 shows a variation on the experimental arrangement of FIG. 25;

FIG. 27 illustrates an experimental arrangement for producing an entangled photon pair for sources in accordance with the above embodiments;

FIG. 28 shows a variation on the apparatus of FIG. 27 for obtaining an entangled photon pair;

FIG. 29 illustrates a further experimental arrangement for obtaining an entangled photon pair using a source in accordance with any of the above embodiments;

FIG. 30 illustrates a further experimental arrangement for obtaining an entangled photon pair using a source in accordance with any of the above embodiments; and FIG. 31 illustrates a further experimental arrangement for obtaining an entangled photon pair using a source in accordance with any of the above embodiments.

A simple quantum dot in a p-i-n structure is illustrated in FIG. 1a. FIG. 1a illustrates the conduction band 1 and valence band 3. A p-type region 5 is provided on the left hand side of the structure. In the p-type region 5, there is an excess of holes 7 located in the valence band. The p-type region 5 is connected to intrinsic region 9. Quantum dot 11 is provided in intrinsic region 9. The intrinsic region 9 is connected to n-type region 13 on its opposing side to p-type region 5. Excess electrons 15 are located in the valence band of n-type region 13.

There is an internal electric field within the device due to the p-type region 5 and n-type region 13. The p-type region 5 is thus at a higher potential than the n-type region when there is no applied bias across the source.

FIG. 1b illustrates the situation when the p-type region 5 is positively biased with respect to the n-type region. This reduces the potential of the p-type region 5 with respect to the n-type region 13. When the potential of the p-type region 5 approaches that of the n-type region 13, electrons 17 diffuse from reservoir 15 and holes 19 diffuse from p-type reservoir 7. Some of the electrons 17 and holes 19 are captured by quantum dot 11. When an electron and hole are trapped in a single quantum dot, they recombine to emit a photon.

Figure 2:
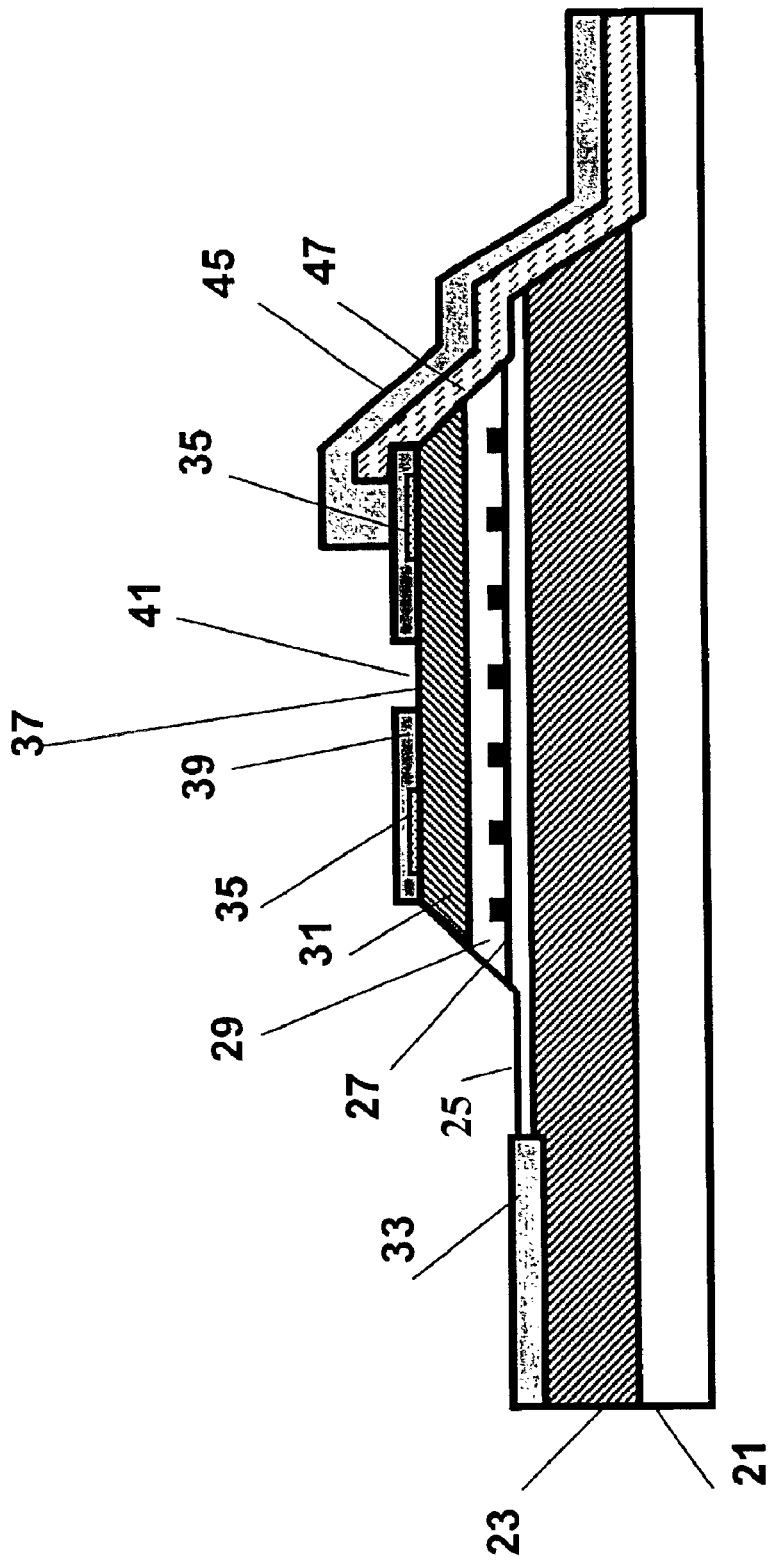
FIG. 2 illustrates a source in accordance with a first embodiment of the present invention.

FIG. 2 illustrates a device in accordance with a first embodiment of the present invention.

The device is formed by molecular beam epitaxy (MBE) on a semi-insulating GaAs substrate. A GaAs buffer layer 21 is formed overlying and in contact with the substrate (not shown). P-type layer 23 is then formed overlying and in contact with buffer layer 21. The p-type layer is 500 nm thick and comprises GaAs doped with Beryllium at a concentration of $5 \times 10^{18}$ cm$^{-3}$. A first intrinsic layer 25 comprising 500 nm of undoped GaAs is formed overlying and in contact with said p-type layer 23.

The buffer layer 21, p-type layer 23 and first intrinsic layer 25 were grown at a temperature of 600° C. The growth was then interrupted for 30 seconds and the substrate temperature was lowered to 500° C. A InAs quantum dot layer 27 was formed from approximately 1.8 monolayers of InAs. Due to the lattice mis-match between InAs and GaAs, the InAs grown by the Stranskii-Krastinow mechanism forms islands on the growth surface. After over growth these islands form quantum dots.

Typically, these quantum dots can be grown with a substrate temperature between 450 and 520° C. The thickness of the InAs layer should be in the region of 1.6 to 4 monolayers. By controlling the deposition conditions the quantum dots can be optimised to emit at the desired wavelength.

A second intrinsic layer 29 comprising undoped GaAs is then formed overlying and in contact with the quantum dot layer 27. This layer may be grown at 500° C. Alternatively, the first 5 nanometers of this layer can be grown at this lower temperature and then the temperature may be raised to the original 600° C. growth temperature. In total this layer 29 is 200 nm thick.

The structure is then finished with n-type layer 31. N-type layer 31 comprises 100 nm GaAs doped with silicon at a concentration of $1 \times 10^{18}$ cm$^{-3}$.

On fabricating the structure, first, a p-type contact 33 is made to p-type layer 23. The p-type contact is made by defining a pattern of contacts using standard photolithography techniques in such a way that photoresist was removed from the contact region.

The contact region was etched, thus removing the n-type layer 31, the first and second undoped layers 25 and 29 and the dot layer 27 from the contact region. The etch progressed into the p-type layer 23. AuBe alloy was then thermally evaporated onto the surface of the p-type layer 23 and a lift-off technique was used to remove the AuBe with underlying photoresist from the remainder of the surface to leave a clearly defined p-type contact 33.

The contact was then rapidly annealed at 480° C. for 180 seconds to alloy the metal and the p-type GaAs. The annealing was performed in a reducing atmosphere of $N_2+H_2$.

Any other suitable metal which forms Ohmic contacts to p-type GaAs could also be used, for example AuZn.

Next, n-type contacts 35 were defined in the same manner as the p-type contacts, the pattern of contacts was defined using photoresist. The resist was patterned and developed such that resist was removed from the contact regions. PdGe alloy was then evaporated onto the top of the sample and removed from the surface except from the contact regions using a lift-off technique. PdGe forms shallow contacts. On annealing these contacts at 380° C. for 300 seconds in a reducing atmosphere of $N_2+H_2$, these contacts form a good Ohmic connection to n-type layer 31 but do not short to the underlying p-type layer 23. As these contacts are annealed at a much lower temperature than the p-type contacts, the p-type contacts are not affected by the annealing of the n-type contacts.

A mesa structure was then formed. Mesa 37 defines the area of the dot layer. The mesa can be up to 100 µm in diameter, but the preferred diameter is 2–10 µm. A circular mesa is preferred.

Two preferred techniques were developed for defining a mesa. In the first technique, the pattern of the mesa was defined using photoresist, the pattern of the photoresist and the type of photoresist was chosen such that after development, resist covered the surface of the mesa. The wafer was then wet-etched using a solution of $H_2SO_4$ (31%):$H_2O_2$(96%):$H_2O$ with a volume of 1:10:800 to a depth of 500 nm. The etch depth was chosen so that it stopped in undoped first GaAs layer 25.

Although the above etch is preferred, any etch solution which can etch GaAs can be used including different compositions of the above etch, or other mixtures such as HCl:$H_2O_2$:$H_2O$. Dry etching could also be used.

90 nm of Al 39 is then evaporated onto the top of mesa 37. This is achieved using standard photolithographic and evaporation techniques.

In the second technique, the photoresist chosen and patterned so that it was removed from the surface of the mesa. A 90 nm thick layer of Al was then thermally evaporated onto the sample and a lift-off technique was used to remove the Al from everywhere except the top of the mesa. This Al layer 39 was then used as the etching mask. The mesa was then etched using any of the above etches previously described.

Although Al is the preferred material for the mask, any material of any thickness can be used providing that it fulfils the following criteria: firstly the mask needs to be essentially opaque to radiation emitted by the dot; secondly the mask needs to be chemically resistant to the solution used to etch the mesa; thirdly the mask should also be easy to selectively etch so that when it is subsequently etched in the following steps, the surface of the GaAs is not damaged.

Regardless of how the mesa and mask 39 are formed, eventually, the resulting structures are largely identical in that they comprise the same layer configuration, same contact configuration, and a mesa, the top of which is covered by a 90 nm Al layer.

As mentioned above, the Al layer is opaque to the light emitted by the dots. In order to allow emission from the device from either a single dot or a limited number of dots, a small emission aperture 41 must be formed in the mask 39.

Electron beam lithography is used to form windows with an area between 0.01 and 4 µm² in the mask. This is achieved by spinning on an electron beam lithography resist such as PMMA, defining the window using an electron beam, developing the resist and then etching using Shipley developer for AZ 1800 series photoresist. However, any wet or dry etcher that attacks Al but not GaAs or the etch mask can be used. For example, NaOH:$H_2O_2$:$H_2O$. When the mesa is defined by using mask layer 39 as a etching mask, it may also be necessary to etch along the edge of the mesa to prevent the Al mask from short circuiting to the p-doped layer 23 as the Al mask 39 may have been slightly undercut by the mesa etch.

As an alternative to electron beam lithography, photo lithography may be used. For example, when the aluminium mask 39 is formed after the mesa etch, the mask may be formed with a small aperture 41 or apertures.

A second isolated mesa is defined around the first mesa and p-type contacts 33 to limit the area of the p-type layer 23. This second mesa may be formed using the first technique discussed above where photoresist covers the top of the mesa and the semiconductor outside the photoresist etched through the p-type layer into the undoped layers below.

The above fabrication techniques allow light to be collected from a single quantum dot or a small number of quantum dots while still allowing a reasonably large contact area for contact to the top of the mesa.

External electrical connection may then be made to the top of the mesa using a contact metal layer which leads to large area contact pads formed away from the mesa. To prevent the contact metal 45 from shorting to the exposed layers on the sides of the mesa, the contact metal 45 is provided overlying an insulating layer 47.

The insulating layer 47 was deposited by spinning onto the device photo-sensitive organic compound polyimide. This insulator can be processed in a similar manner to that of photoresist. The polyimide was cured by baking it on a hot plate at 115° C. for 900 seconds. The layer was then exposed to UV light through a chrome-on-glass mask. UV light cross-linked the polyimide so that when the layer was exposed and developed, only the unexposed areas of the polyimide were dissolved. The insulating layer was 500 nm thick.

A patterned metal NiCr/Au layer was formed over the insulator to provide the contact metal 45, this formed contact pads well away from the second isolated mesa.

Although NiCr/Au is used, other metals may be used providing they can be adhered to the device and provide high electrical conductivity. The top of the contact metal needs to be chemically inert to avoid degradation over time. For example, if the contact metal comprises more than one layer, then only the top layer needs to be chemically inert.

The above fabrication is a preferred example. Other techniques may be used or variations on the above are possible. The order of the processing steps may be varied dependent on the annealing temperatures of the n-type and p-type contacts and the thermal stability of the material of the light emission mask 39. It is always important to process this structure so that annealing one contact does not affect a previously annealed contact. This is usually achieved by processing the layers which require higher temperature annealing first.

In addition to the above, it is important to ensure that none of the processing steps prior to the formation of aperture 41 cause the material of the emission mask to react with GaAs to form an opaque compound which is difficult to remove.

The p-type contact was formed by exposing the p-type layer 23 through etching. However, it is also possible to make this contact from the substrate side of the device if the buffer layer 21 and substrate (not shown) conduct.

Figure 1:
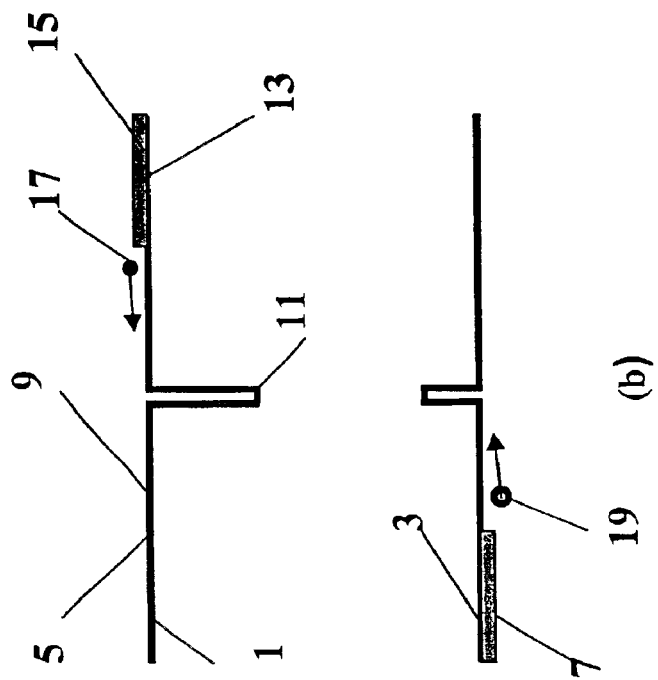
FIG. 1a shows a schematic of the conduction and valence band profiles for a p-i-n type structure with a quantum dot located in the intrinsic region at zero applied bias.
FIG. 1b illustrates the same conduction and valence band profile at a positive bias.
Figure 1:
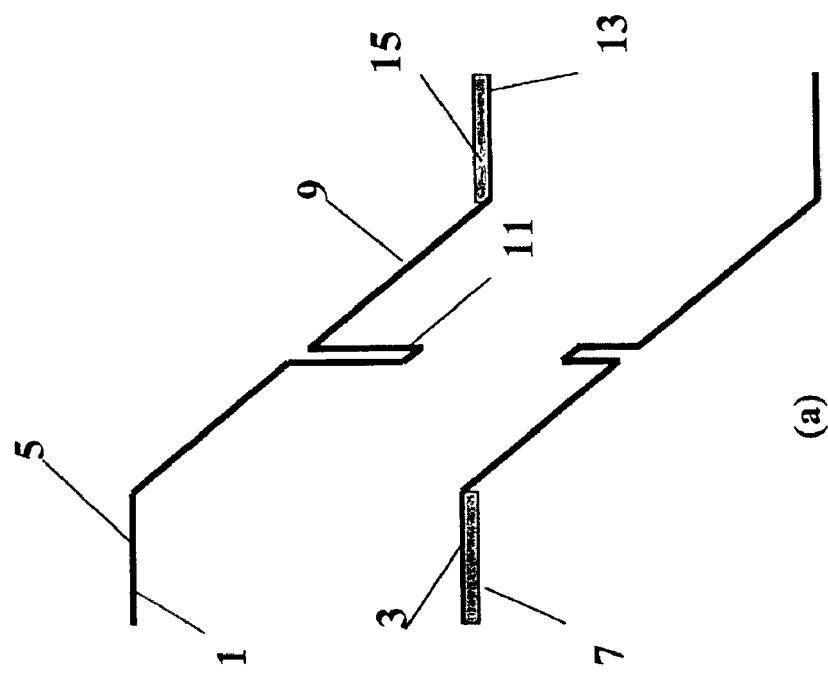

Operation of the device follows the principle of that described with reference to FIG. 1. By positively biasing the p-type layer 23 with respect to the n-type layer 31, it is possible to diffuse electrons from the n-type layer 31 towards the p-type layer 23 and holes from the p-type layer 23 towards the n-type layer 31. Some of these electrons and holes will be trapped within quantum dot 27. When an electron and hole are trapped within one of the quantum dots, they recombine to emit a photon which has an energy substantially equal to that of the band gap of the quantum dot.

This device has a plurality of quantum dots. However, due to the formation of the opaque mask 39 with its small emission aperture 41, only the dots directly underneath the emission aperture 41 can emit photons which are collected. These dots are referred to as the dots within the 'active region' of the device. Dots outside the active region may emit photons. However, these photons will be blocked by mask 39 and cannot contribute to the signal emitted from the device.

Figure 3:
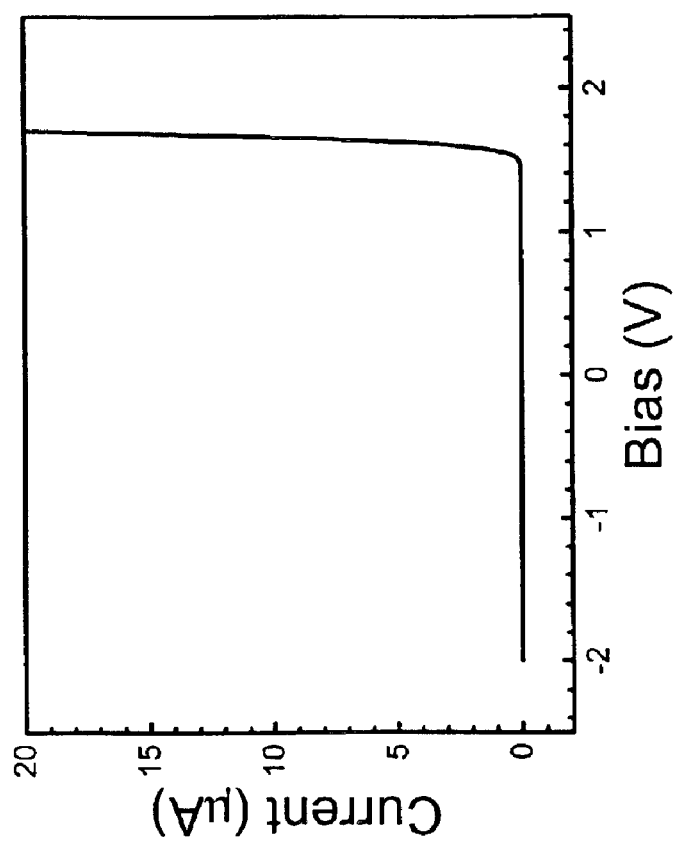
FIG. 3 illustrates current-voltage characteristics measured from a device in accordance with an embodiment of the present invention.

FIG. 3 shows the current-voltage characteristics measured at 4K on a device similar to that illustrated in FIG. 2. Current flow is measured between the n layer and the p layer. The bias represents the bias applied to the p-type layer with respect to the n-type layer. When the bias is increased to approximately 1.6 volts, a current flows through the device. It will be appreciated by those skilled in the art that this plot illustrates that the device shows very close to ideal diode behaviour, with a large current flow across the device in forward bias and no current flow at less than about 1.6 volts. In this device, the mesa was approximately 10 $\mu$m by 10 $\mu$m.

Figure 4:
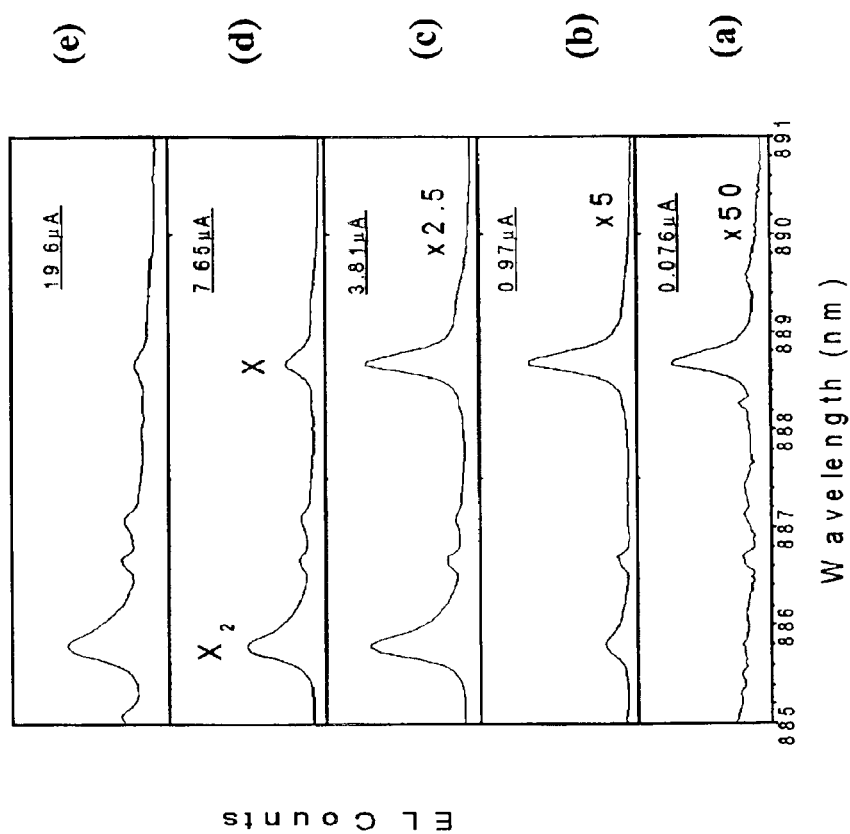
FIG. 4a illustrates a plot of electro-luminescence count against wavelength for a source in accordance with an embodiment of the present invention, a driving current of 0.076 $\mu$A is used.
FIG. 4b illustrates the results for a current of 0.97 $\mu$A, FIG. 4c for a current of 3.81 $\mu$A, FIG. 4d for a current of 7.65 $\mu$A and FIG. 4e for a current of 19.6 $\mu$A.

FIGS. 4a to 4e illustrate electro-luminescence spectrum recording using a 0.46 m focal length spectrometer with a 1200 g/mm diffraction grating. The forward bias and hence the current through the device increases from FIGS. 4a to 4e. In FIG. 4a, a current of 0.076 $\mu$A is measured through the device. A small sharp peak is shown at around 888.7 nm. This peak is the single exciton emission peak and is due to the recombination of an electron and a hole which are trapped in the quantum dot.

In FIG. 4b, the current is raised to 0.97 $\mu$A. The peak is seen to be approximately ten times larger in FIG. 4b than it is in FIG. 4a. In FIG. 4a, the data is multiplied by a factor of 50, in FIG. 4b, it is only multiplied by a factor of 5. A further peak is also seen to occur at 885.6 nm. This peak is due to population of the dot with two electrons and two holes. When the first electron hole pair combine, a bi-exciton emission is observed.

In FIG. 4c, the bias is further increased and a current of 3.81 $\mu$A is observed. This data is magnified by a factor of 2.5. Here, it can be seen that the single exciton peak (peak is approximately 888.7 nm) has increased by height by a factor of about 2 from that shown in FIG. 4b. The bi-exciton peak increases more rapidly and is approximately the same size as the single exciton peak. Due to the larger current flow, the chances of two electrons and two holes being trapped in the dot is substantially increased.

In FIG. 4d, the forward bias is increased yet further and the current is 7.65 $\mu$A. This data has not been magnified. The single exciton peak is seen to now be much smaller than the bi-exciton peak.

In FIG. 4e, the forward bias is further increased and a current of 19.6 $\mu$A is measured across the device. The single exciton peak has virtually disappeared at this high bias and the bi-exciton peak is seen to dominate the trace.

The primary use for the device of FIG. 2 is a single photon emitter. In order to test that the photons are emitted one by one from the quantum dot, a Hanbury-Brown and Twiss correlation measurement on the electro-luminescence emitted by the dot is performed. In this experiment, electro-luminescence is collected from the sample and filtered using a spectrometer to just allow photons with a wavelength of 888.7 nm to pass.

Figure 5:
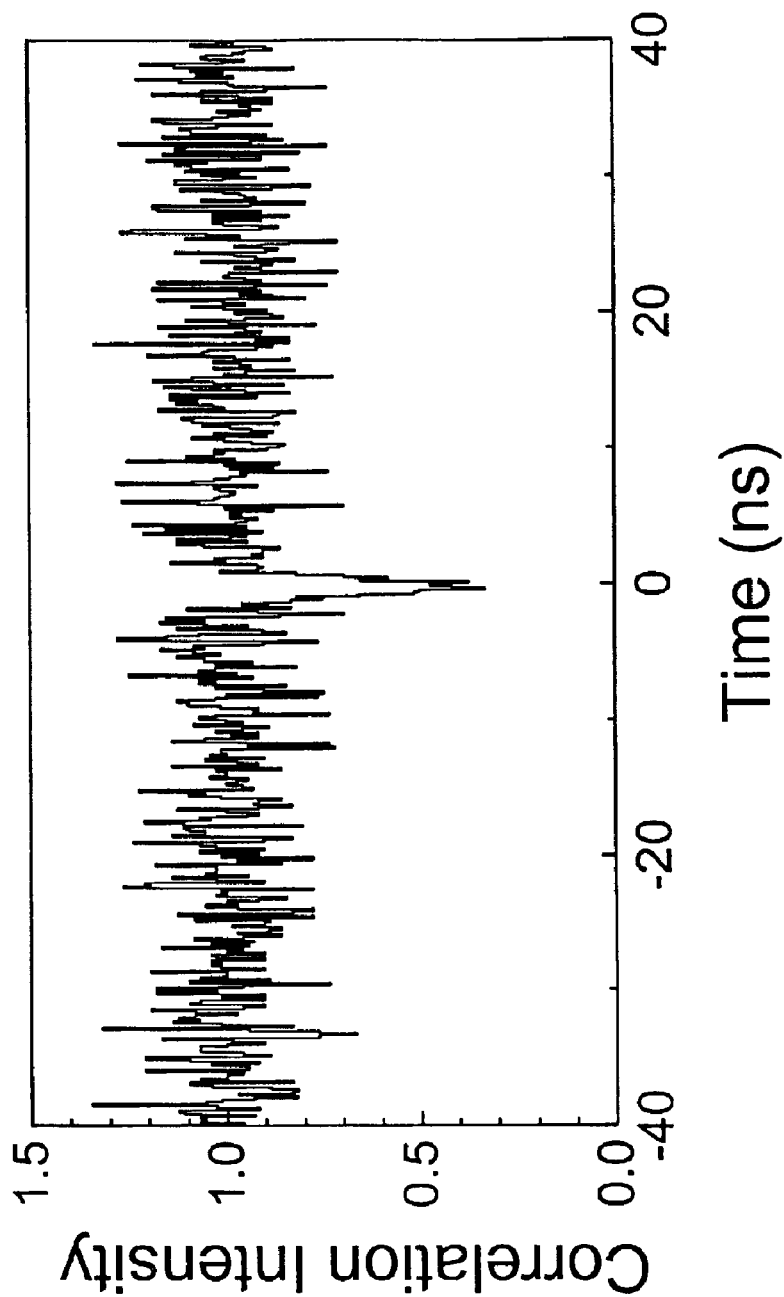
FIG. 5 illustrates results from a Hanbury-Brown and Twiss correlation measurement for electro-luminescence emitted by a source in accordance with an embodiment of the present invention.

The filtered light was then passed through a 50/50 beam splitter and the transmitted and reflected arms of the beam splitter were detected using two separate single photon detectors. Here, silicon avalanche photon diodes were used as single photon detectors. The time delays between the pairs of photons emitted by the quantum dot were recorded using a time interval analyser connected to the two single photon detectors. These results were then used to generate the plot of FIG. 5, wherein the second order correlation function $g^{(2)}(\ )$ is plotted along the y axis and the time delay ( ) between the pair of photons is plotted on the x axis. There is a large dip in the correlation signal at zero, with an amplitude more than 50% of the average level. The finite value of $g^{(2)}(0)$ derives from the finite time resolution of the measurement system.

This clearly demonstrates that there is a strong suppression of emission of two photons from the dot within a short time interval. This observation of so-called photon anti-bunching is used to unambiguously show the signature of single photon emission from a device.

Electroluminescence from regions of the device other than the quantum dot can be suppressed by reducing the size of the emission aperture so as to block more of the background emission. This reduces the occurrences of 2 photon emission by the device.

Figure 6:
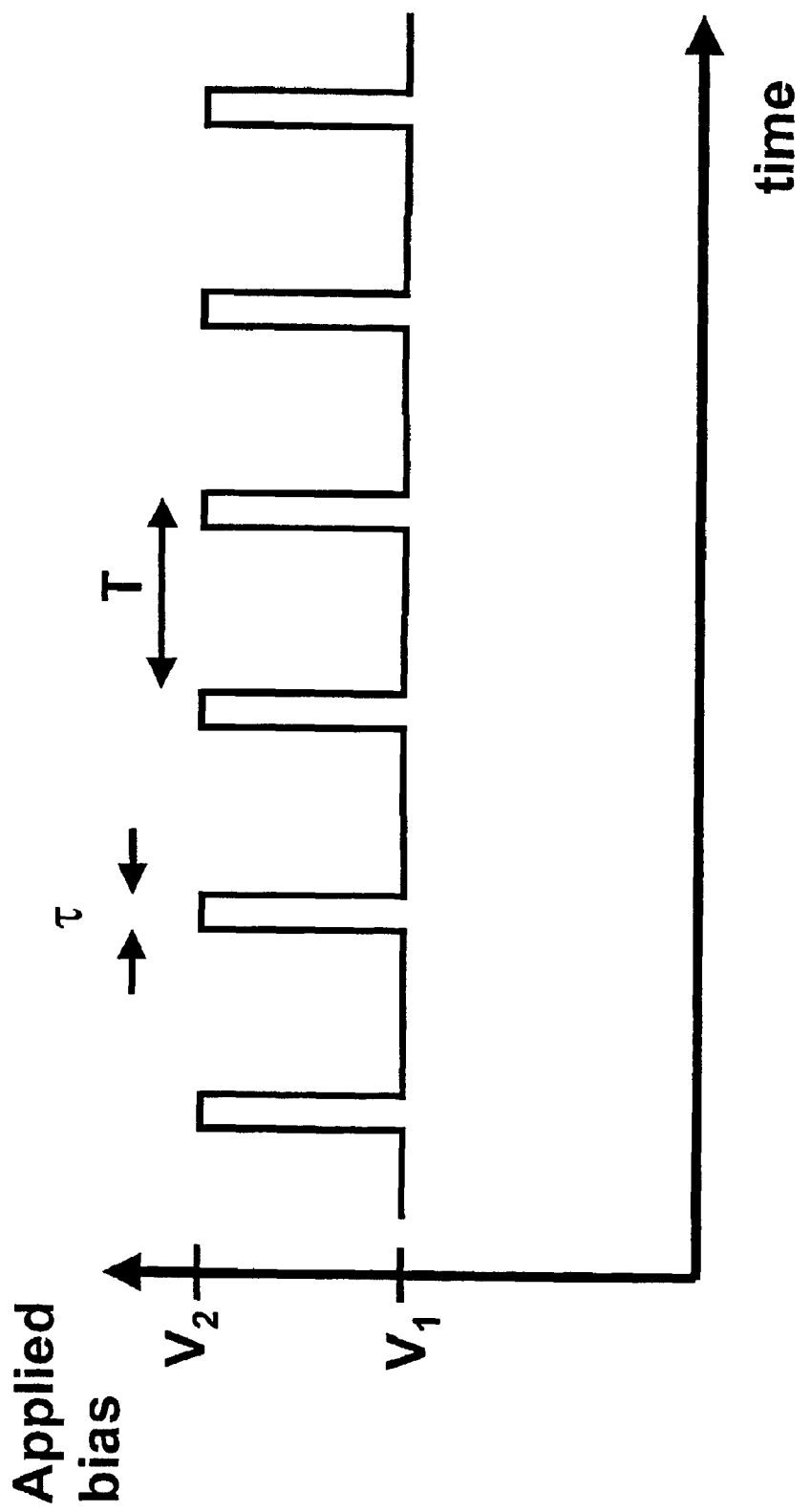
FIG. 6 illustrates a schematic plot of a pulsed bias which may be used to operate the device of FIG. 2.

In order to control emission from the device, a pulsed bias may be applied to the device of the type indicated in FIG. 6. In FIG. 6, the bias is switched between a lower level of $V_1$ and a higher level $V_2$. The bias pulse width ( ) is the time during each pulse when the voltage is raised to level $V_2$. The signal has a period T.

The photon emission time will correlate with the time when electrons and holes are injected into the quantum dot. Thus, pulsing the dot with a signal having a period T will result in emission from the dot having a period T. If the bias pulse width τ is less than the radiative life time of the relevant electron-hole recombination process in the dot, the relevant radiative state will be populated just once by each pulse. This is because once that state has been excited, the voltage will be dropped to $V_1$ before the state decays. Thus, it is possible to produce just one photon per bias pulse.

It is also possible to use this pulsed bias scheme to excite a bi-exciton transistion. For this, a larger value of $V_2$ may be required.

For high frequency modulation of the voltage of the device, it is desirable to minimise the capacitance and transit time of the p-i-n junction, as well as stray capacitances. A good compromise to minimise the transit time and junction capacitance, is to form the device with a 0.3 μm thick intrinsic region and 10 μm diameter mesa. (The intrinsic region being the region between the p and n-type regions.) As such the device can be modulated to frequencies of several tens of GHz. For higher frequency modulation, the mesa area can be reduced and the intrinsic layer thickness reduced. For instance, the mesa can have a 5 μm diameter and the 0.2 μm thick intrinsic region.

$V_1$ or $V_2$ may be selected on the basis of the desired operational mode. FIGS. 1a and 1b schematically illustrate a first operational mode, FIG. 1a being at bias $V_1$ where no electrons or holes are delivered to the quantum dots and FIG. 1b at bias $V_2$, where a diffusion current flows across the intrinsic region due to the device being in forward bias.

Figure 7:
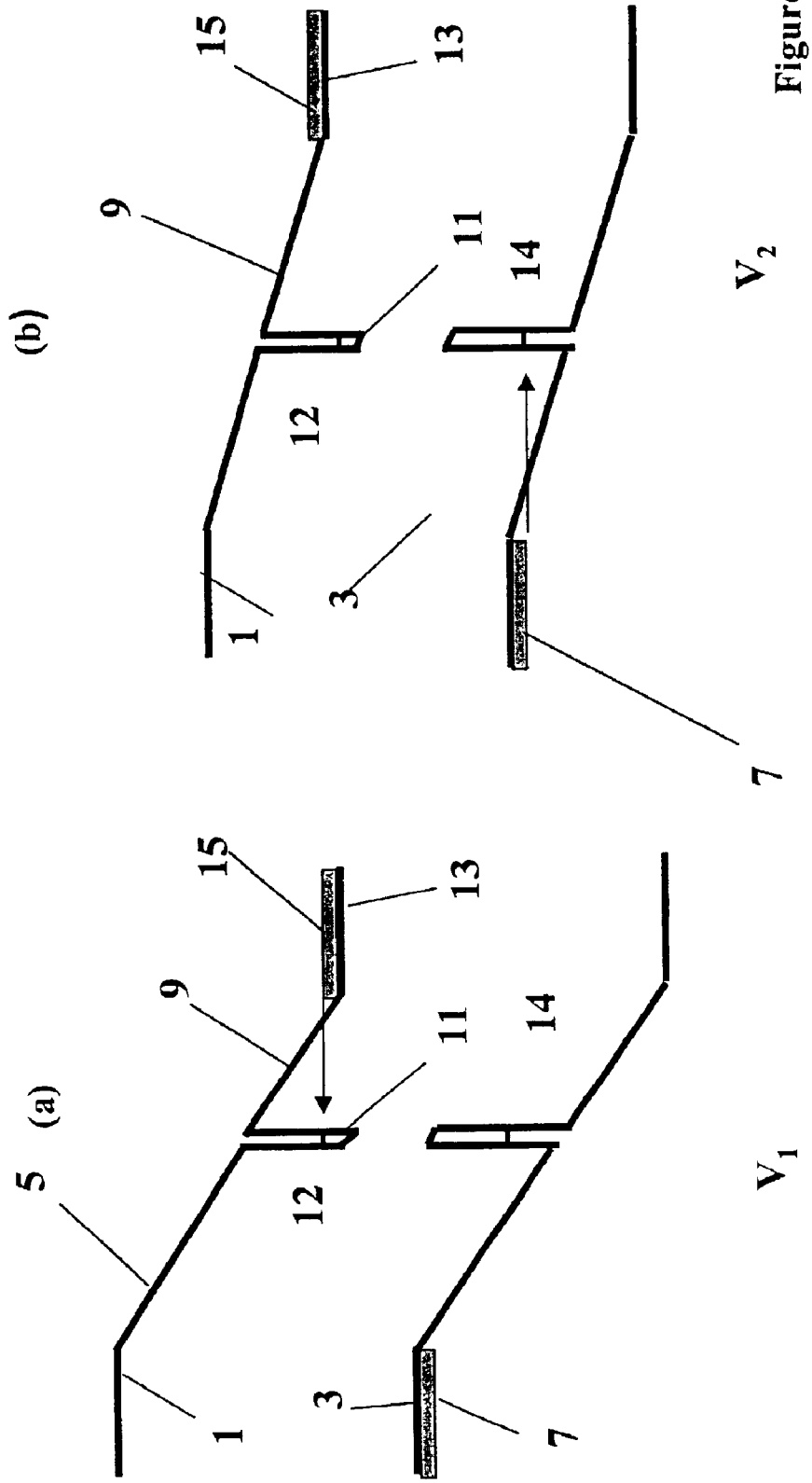
FIG. 7a illustrates a schematic band diagram for a device in accordance with an embodiment of the present invention at an applied bias of $V_1$ and FIG. 7b the corresponding band diagram for $V_2$, where $V_1$ and $V_2$ correspond to biases $V_1$ and $V_2$ of FIG. 6.

However, other modes of operation are also possible. FIGS. 7a and 7b illustrate schematic band diagrams for a second mode of operation. FIG. 7a corresponds to a bias of $V_1$ and FIG. 7b corresponds to a bias of $V_2$.

The band diagram of FIG. 7a is similar to that of FIG. 1a. Therefore, to avoid unnecessary repetition, like reference numerals will be used to denote like features. There is a vacant conduction band energy level 12 in the quantum dot 11 and a vacant valence band level 14 in the quantum dot 11.

By careful selection of the applied voltage levels, it is possible to provide the electron and hole required for photon emission in a precisely controlled way. As the voltage applied to the device increases, but is still well below the threshold bias at which current flows across the intrinsic region 9 (for example, see FIG. 1b), the energy of the electrons in the n-type material increases. At voltage $V_1$, shown in FIG. 7a, the energy of the carriers 7 in the n-type region 5 approaches that of the first electron level 12 of quantum dot 11.

Under these conditions, a single electron can now resonantly tunnel into the dot 11 from the n-type material 13. The charge of this electron increases the amount of energy required for a second electron to tunnel in, ensuring the dot is occupied by just a single electron.

It is then possible to increase the voltage further to $V_2$ as shown in FIG. 7b. At this bias, the energy of the carriers 7 in the p-type region 3 aligns with that of the first valence band energy level 14 in the quantum dot. Under these conditions, a single hole can resonantly tunnel into the same dot 11, in much the same way as for the electron.

Thus, the dot has a single electron and hole pair, these recombine and a single photon is emitted. The voltage is switched periodically between $V_1$ and $V_2$, as shown in FIG. 6, emitting a stream of single photons. Since photons are only emitted by the switching between the two voltages, it is not necessary to minimise to ensure single photon emission. For this reason, can be equal to T/2, and in general both T and can be any value, preferably as short as possible to maximise the operating frequency of the device, while still switching at a rate slower than the radiative rate of the exciton.

This method of current injection has certain advantages over switching between the on and an off state of the diode device as previously described. Firstly, since this is a resonant process, fewer dots are selected for current injection due to the non-uniform distribution of dot shapes, sizes, and compositions. This provides another means to select one dot or a small number of dots from the dot layer.

Secondly, the type of exciton complex in the dot is precisely controlled, thus increasing the efficiency of the device by directing all emission to the same wavelength. Thirdly, since the voltages used here are below the threshold of the diode, background emission from other regions of the device is suppressed.

Figure 8:
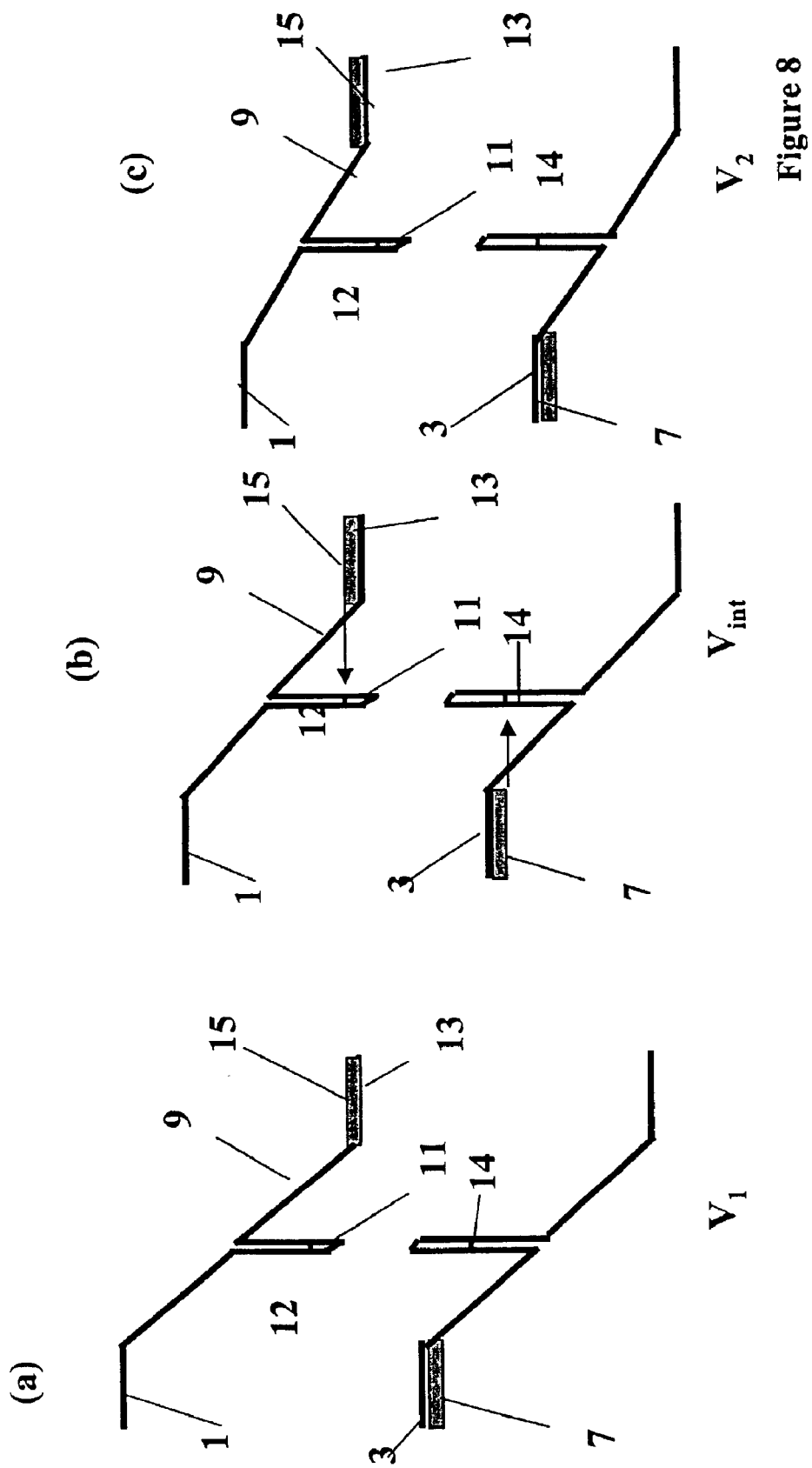
FIG. 8a illustrates a schematic band diagram for a device in accordance with an embodiment of the present invention at an applied bias of $V_1$ and FIG. 8b the corresponding band diagram for $V_{INT}$ and FIG. 8c at $V_{INT}$, where $V_1$, $V_2$ and $V_{INT}$ correspond to biases $V_1$ and $V_2$ of FIG. 6 and $V_{INT}$ is at a level between $V_1$ and $V_2$.

FIGS. 8a, 8b and 8c illustrate a further mode of operation. FIG. 8a schematically illustrates the band structure of the device at $V_1$ and FIG. 8b illustrates the band structure at $V_{int}$ and FIG. 8c illustrates the band structure at $V_2$. $V_{int}$ is an intermediate voltage between $V_1$ and $V_2$, thus as the bias is switched between $V_1$ and $V_2$ as shown in FIG. 6, the bias is swept through voltage $V_{int}$.

By the careful selection of the width of the layers between the n-type and p-type regions, the device can be designed so that it is also possible to resonantly inject a hole and an electron simultaneously at the same voltage. Thus, at voltage $V_{int}$ the energy of the electrons 15 in the n-type region 13 aligns with the energy of the conduction band level 12 and the energy of holes 7 in the p-type region 3 aligns with the valence band level 14 in dot 11. $V_1$ and $V_2$ are voltages above and below the injection resonance. Current is then injected as the voltage is swept through resonance.

Figure 9:
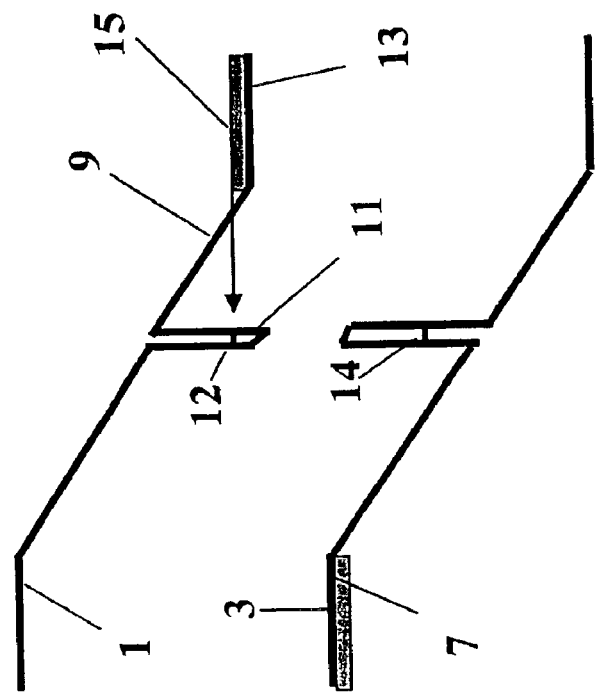
FIG. 9a illustrates a schematic band diagram for a device in accordance with an embodiment of the present invention at an applied bias of $V_1$ and FIG. 9b the corresponding band diagram for $V_2$, where $V_1$ and $V_2$ correspond to biases $V_1$ and $V_2$ of FIG. 6.
Figure 9:
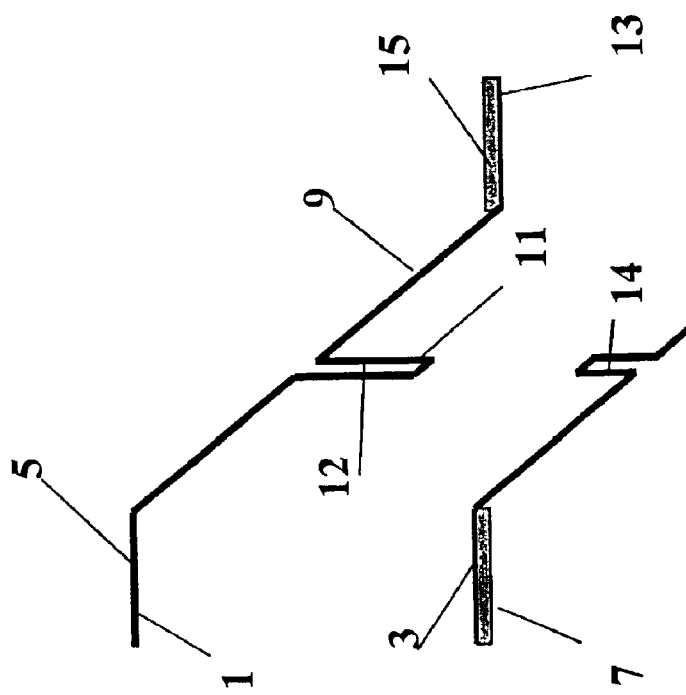

FIGS. 9a and 9b illustrate a further mode of operation. FIG. 9a schematically illustrates the band structure at $V_1$ and FIG. 9b the band structure at $V_2$. In this mode of operation, only one type of carrier resonantly tunnels into dot 11. At bias $V_1$, no carriers can tunnel into quantum dot 11. At $V_2$ electrons can resonantly tunnel from the n-type region 13 into the conduction band energy level 12. The hole then diffuses into the dot 11. This will provide periodic emission of single photons if the diffusion time of a hole into the dot is faster than T.

Figure 10:
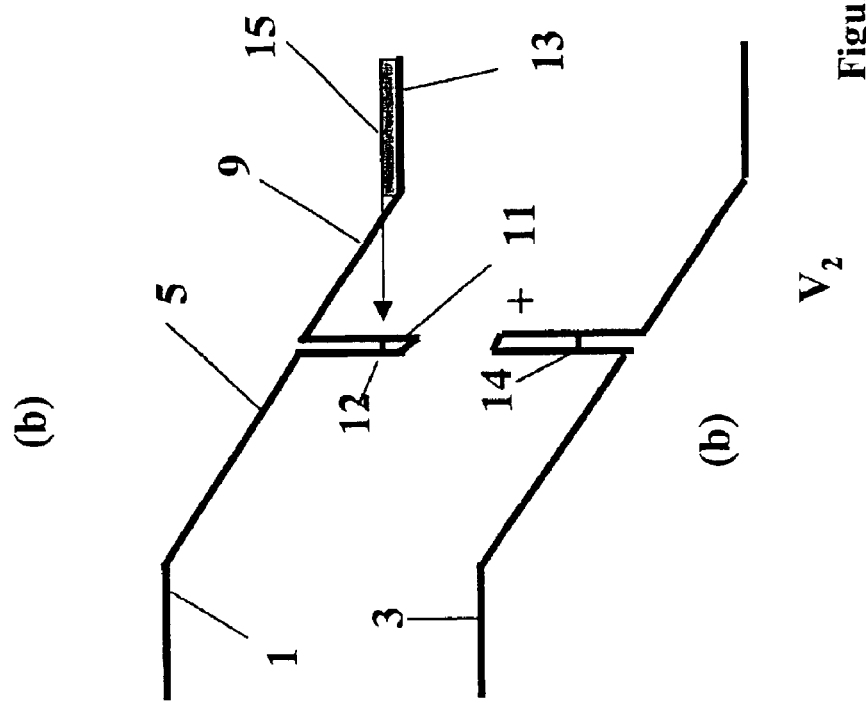
FIG. 10a illustrates a schematic band diagram for a device in accordance with an embodiment of the present invention at an applied bias of $V_1$ and FIG. 10b the corresponding band diagram for $V_2$, where $V_1$ and $V_2$ correspond to biases $V_1$ and $V_2$ of FIG. 6.
Figure 10:
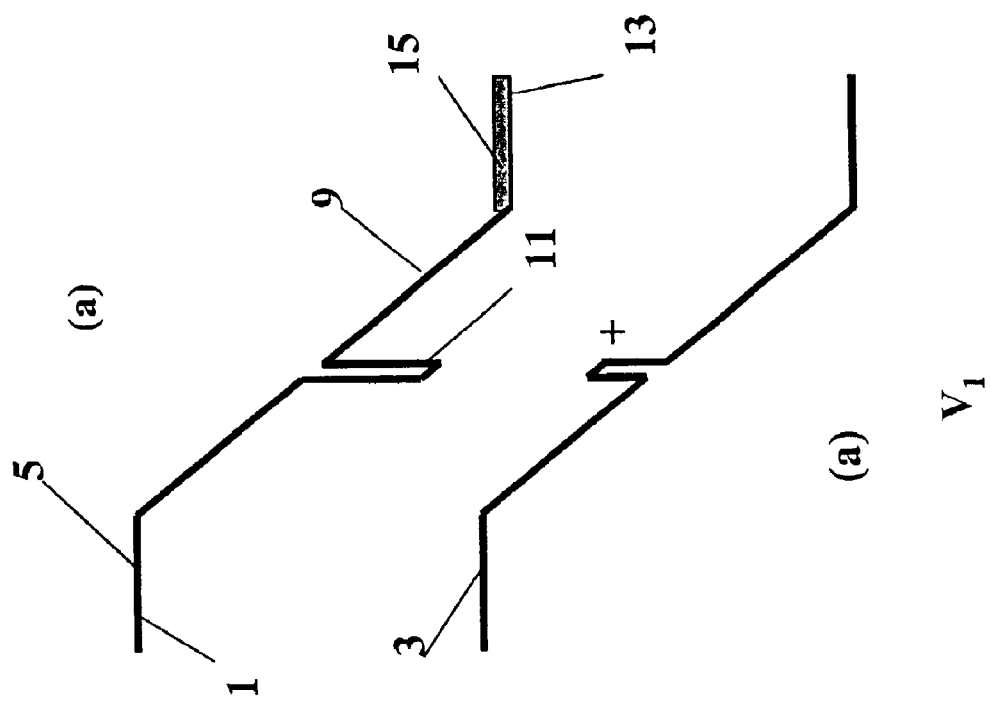

FIGS. 10a and 10b illustrates a further mode of operation. FIG. 10a illustrates the device at $V_1$ and FIG. 10b at voltage $V_2$. Here, the device is configured such that holes are constantly provided to the quantum dot 11. At $V_1$ electrons do not have enough energy to tunnel into the quantum dot. At voltage $V_2$ the electrons 5 can resonantly tunnel into the quantum dot. An electron in the dot will then combine with the hole to emit a photon. A device which can support this type of operation will be described with reference to FIGS. 22 to 24.

FIGS. 3 to 10b have described the characteristics of the device of FIG. 2. However, these advantages may be achieved, in addition to further advantages, using variations on the device of FIG. 2.

Figure 11:
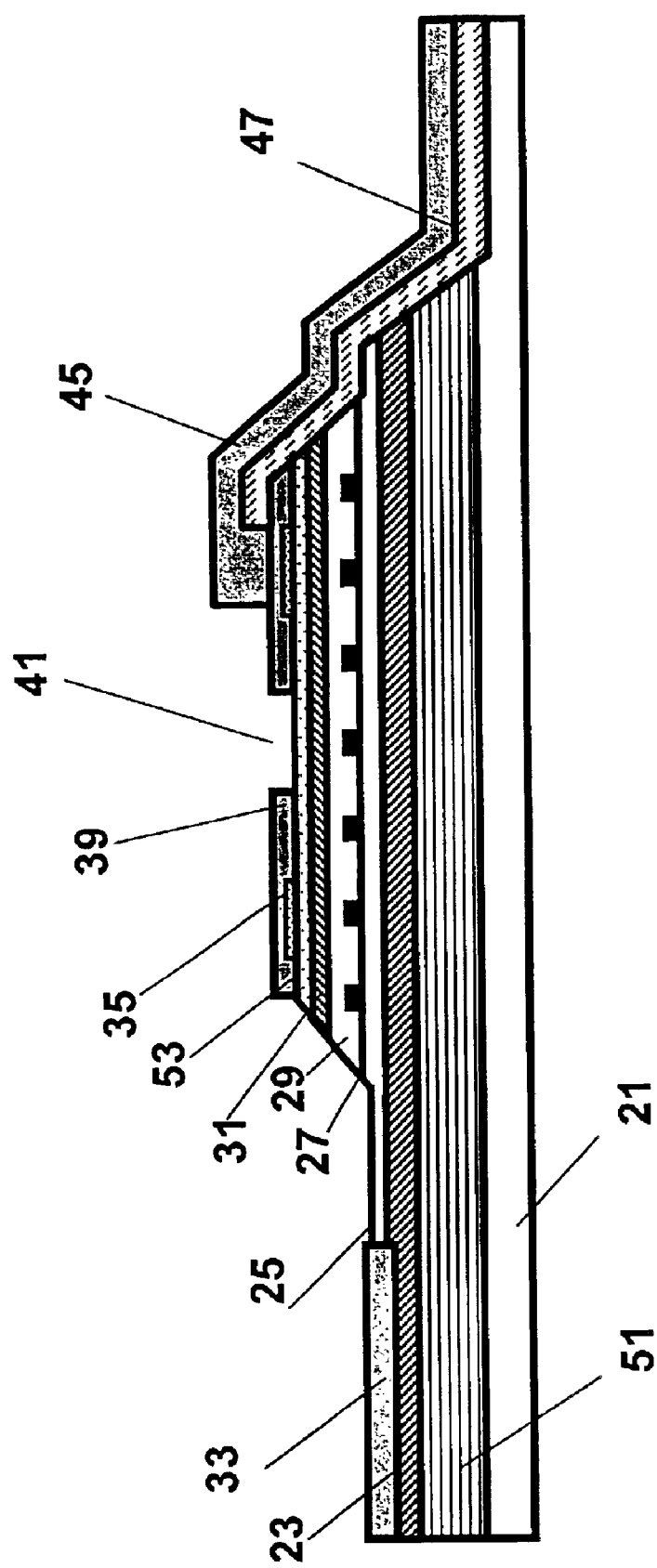
FIG. 11 illustrates a device in accordance with a second embodiment of the present invention.

FIG. 11 shows a further device in accordance with an embodiment of the present invention.

The device is similar to that of FIG. 2. To avoid unnecessary repetition, like reference numerals will be used to denote like features.

In the same manner as the device of FIG. 2, a GaAs buffer layer 21 is formed overlying and in contact with a semi-insulating GaAs substrate (not shown). A lower p-doped Bragg mirror 51 is then provided overlying and in contact with said buffer layer 21. Said lower Bragg mirror comprises 10 pairs of alternating layer of AlAs (110.04 nm) and GaAs (95.46 nm), the GaAs and AlAs layers are p-doped with Beryllium having a concentration of $5 \times 10^{18}$ cm$^{-3}$. Optionally the lower Bragg mirror may also be undoped.

A p-type layer 23 is then formed overlying and in contact with said lower Bragg mirror 51. The p type layer 23 comprises 40.9 nm of GaAs doped with Be having a concentration of $5 \times 10^{18}$ cm$^{-3}$. A first intrinsic GaAs undoped layer 25 is then formed overlying and in contact with said p layer 23. The width of this layer is 148 nm.

A $In_xGa_{1-x}As$ undoped first barrier layer (not shown) having a thickness of 2 nm is then formed overlying and in contact with the first intrinsic layer 25. In this layer, x=0.3.

InAs dot layer 27 is then formed overlying and in contact with first barrier layer (not shown). Approximately 1.8 monolayers of InAs are used to form the dot layer.

A second barrier layer (not shown) comprising $In_xGa_{1-x}As$ layer is then formed overlying and in contact with said dot layer 27. This layer is the thickness of 2 nm and x is 0.3.

A second intrinsic GaAs undoped layer 29 is then formed overlying and in contact with said second barrier layer (not shown). The width of this layer is 148 nm.

N type layer 31 is then formed overlying and in contact with said second intrinsic undoped layer 29. The n-type layer comprises 40.9 nm of doped Si $2 \times 10^{18}$ cm$^{-3}$. The device is then completed with GaAs phase matching layer 53. This layer has a thickness of 70 nm and is doped with Si $2 \times 10^{18}$ cm$^{-3}$.

In the above structure, the dot layer 27 is provided within a two dimensional optical cavity defined by lower Bragg mirror 51 and upper metal layer (that also acts as mask) 39. The cavity is designed to resonate a wavelength of 1300 nm.

The thickness of the Bragg reflector is chosen in order to make it highly reflective at the intended operational wavelength λ. The composition of each layer is chosen so that there is a high refractive index contrast. This can be achieved by alternating AlAs and GaAs layers.

The optical thickness of each pair of layers is chosen to be as close to $\lambda/2$ as possible. The optical length for each layer should be $\lambda/4$ for maximum reflectivity. The number of repeats increases the reflectivity and 10 to 20 pairs of layers should be sufficient for this device operation.

The layers above the lower Bragg mirror 51 and below the phase matching layer 53 form the cavity region. The total thickness of the cavity has been designated to be $\lambda/\eta_{cav}$ and the quantum dot layer 27 is placed at the antinode at the centre of the cavity region.

The quantum dot is located within a resonant cavity. This cavity also acts as a wavelength filter. This is because resonance condition $$L_{cav} = \frac{m\lambda}{2n_{cav}}$$

is satisfied for a narrow range of emission wavelengths. In the above equation, $L_{cav}$ is the width of the cavity, $n_{cav}$ is its refractive index, λ is the wavelength of the cavity mode in vacuum and m is an integer. Thus, if the wavelength of the cavity mode could be matched to the wavelength of the desired excitonic transition, for example, the exciton, bi-exciton or charged exciton transistion of the desired dot, this greatly suppresses the collection of other exciton lines from the same dot as well as emission from other dots under the region of the device.

The phase matching layer is chosen to ensure that a antinode in the optical field is formed at the edge of the boundary between the cavity region, the top of which is bounded by n-doped layer 31 and the phase matching layer.

In this arrangement, only the resonant wavelength is emitted into a narrow core normal to the lower Bragg mirror 51 and upper metal layer 39. Increasing the reflectivity of these layers leads to a sharp cavity mode. This is because the band pass of the structure, which can be thought of as arising from the lifetime of a photon in the cavity, is largely determined by the reflectivity of these two layers. The spectral bandpass of the cavity (or the width of the cavity mode) should ideally be designed to be roughly equal to the spectral width of the relevant exciton line of the relevant emitting quantum dot.

Wavelengths away from the resonant wavelength are emitted at a finite angle with respect to the normal to the mirrors. Thus it is possible to collect more than one quantum dot transistion, by collecting the light emitted at different angles from the device.

The upper and lower barrier layers (not shown) may be chosen in order to allow the dot to have the desired operating wavelength. In this example, x was chosen to be 0.3 to achieve this goal.

The contacts are made to the device and the mesa is fabricated in the same manner as described with reference to FIG. 2. The etch depths are adjusted accordingly to ensure that the mesa is etched as far as the first undoped layer and the p-type and n-type contacts reached their respective layers. The mesa is preferably 10 μm in diameter so as to allow high frequency modulation.

The source may also be fabricated from other material systems. For example, it is possible to form the device on an InP substrate, which is better suited for emission at longer wavelengths. In the following example, the optical cavity is designed for operation at 1.55 μm.

The device is formed in the same manner as described above, but the substrate is InP. Buffer layer 21, comprises $In_{0.52}Al_{0.48}As$. Lower Bragg mirror 51 comprises of 10 pairs of alternating layers of $Al_{0.1}Ga_{0.9}As_{0.5}Sb_{0.5}$ (99 nm) and $AlAs_{0.5}Sb_{0.5}$ (118 nm), p-doped Be $5 \times 10^{18}$ cm$^{-3}$. P-type layer 23 comprises 116 nm of $In_{0.53}Ga_{0.47}As$ doped Be $5 \times 10^{18}$ cm$^{-3}$. First intrinsic layer 25 comprises 100 nm of undoped $In_{0.53}Ga_{0.47}As$. Dot layer 27 comprises 1.8 monolayers of InAs. Second intrinsic layer 29 comprises 100 nm of undoped $In_{0.53}Ga_{0.47}As$. N-type layer 31 comprises 116 nm of $In_{0.53}Ga_{0.47}As$ doped Si $2\times10^{18}$ cm$^{-3}$. Finally, the phase matching layer 53 comprises 76 nm of $In_{0.53}Ga_{0.47}As$ doped Si $2\times10^{18}$ cm$^{-3}$.

Figure 12:
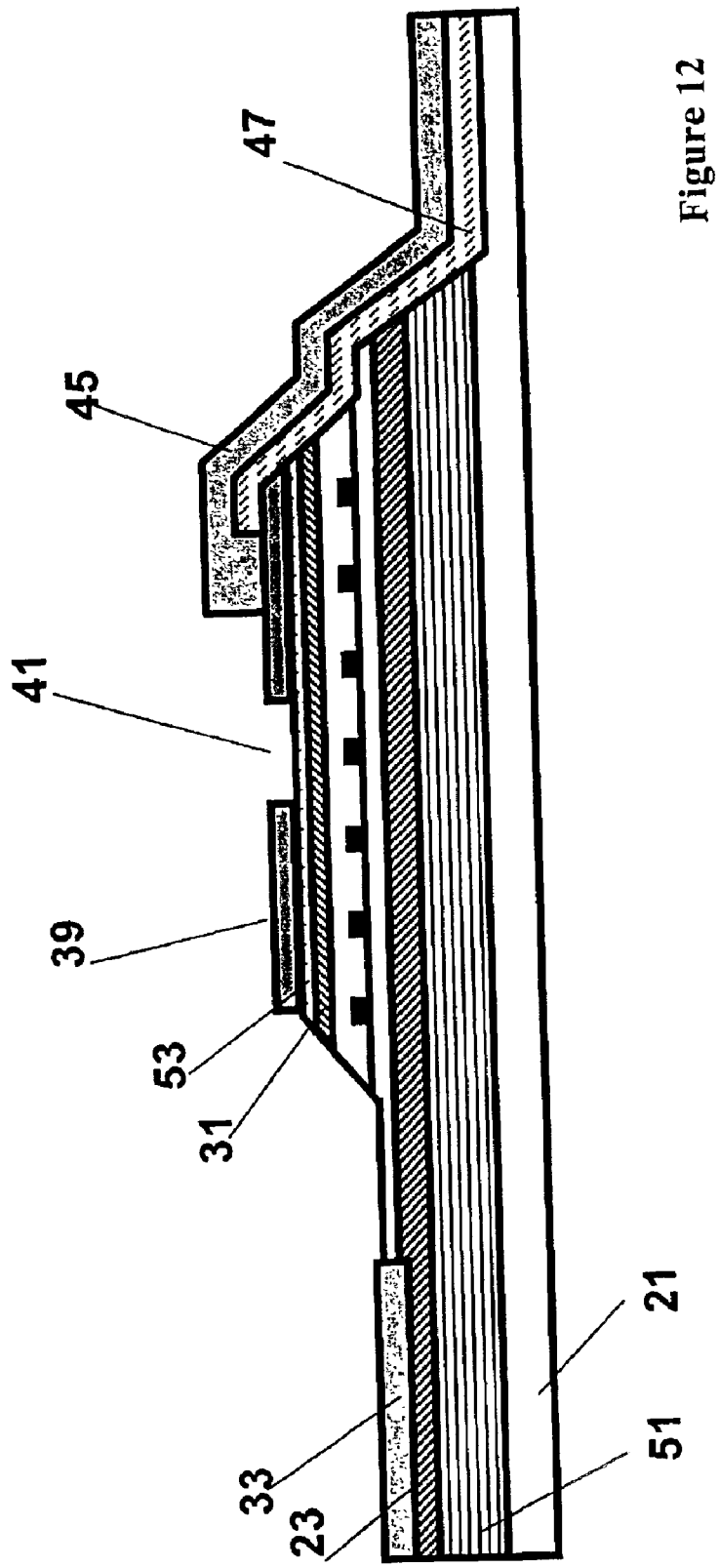
FIG. 12 illustrates a device in accordance with a third embodiment of the present invention.

FIG. 12 illustrates a further embodiment of the present invention. This device is very similar to that described with reference to FIG. 11. However, here, the Al mask layer 39 is also used to provide ohmic contacts. This is because an epitaxially grown Al film can make a good ohmic contact to n+GaAs.

The Al mask layer 39 may be epitaxially grown with the other layers or it may be formed overlying the mesa after processing.

If the Al layer is formed prior to any etching, the Al layer must be removed from the regions where etching of the semiconductor structure is required. In order to ensure that ohmic contact is made to n-type layer 31, n-type layer 31 should be doped with a concentration of about $5\times10^{18}$ cm$^{-3}$.

Figure 13:
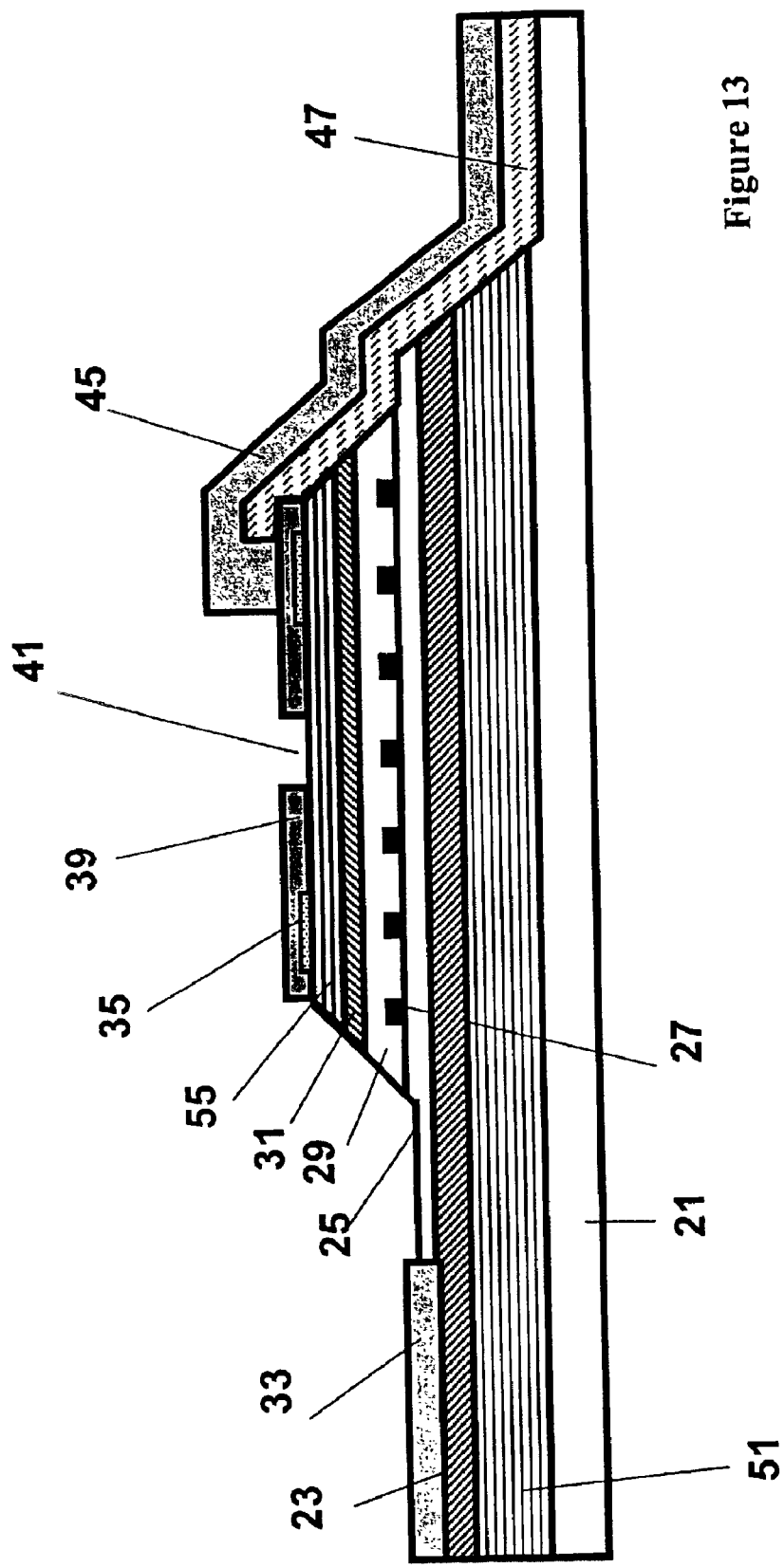
FIG. 13 illustrates a device in accordance with a fourth embodiment of the present invention.

FIG. 13 illustrates a device in accordance with a further embodiment of the present invention.

This device is similar to that described with reference to FIG. 11. However, here, upper Bragg mirror 55 is provided overlying and in contact with n-type layer 31. To avoid unnecessary repetition, like reference numerals will be used to denote like features.

The preferred layer thicknesses and compositions for this structure are the same as those described with reference to FIG. 11. However in this case the phase matching layer is replaced with an upper Bragg mirror 55 which sits on the n-type layer 31. Upper Bragg mirror 55 comprises five pairs of alternating layers of AlAs (111.04 nm) and GaAs (95.46 nm). Both these layers are n-type doped with silicon at a concentration of $4\times10^{18}$ cm$^{-3}$. The processing for this device is identical to that described with reference to FIG. 2.

Figure 14:
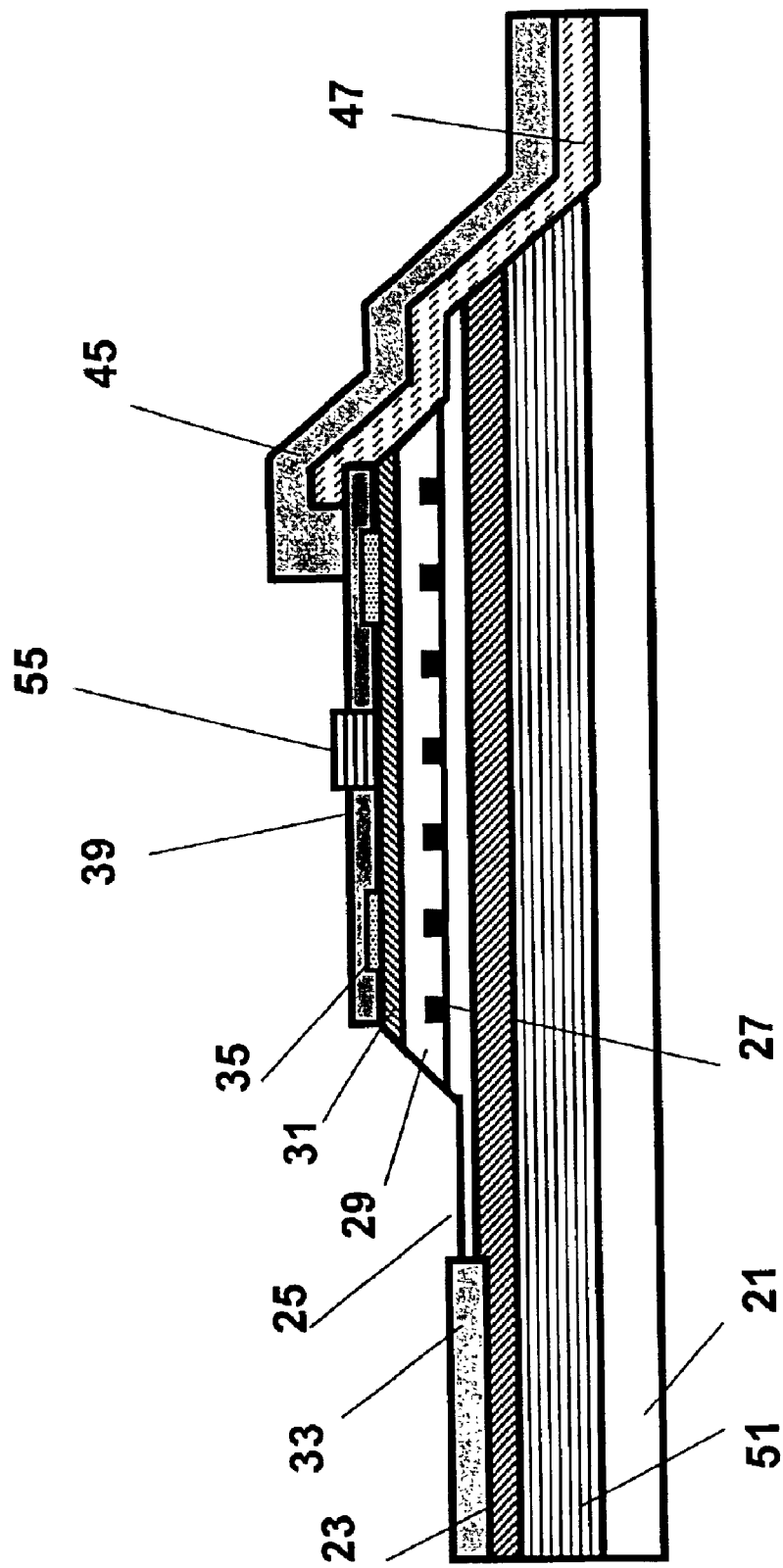
FIG. 14 illustrates a device in accordance with a fifth embodiment of the present invention.

FIG. 14 illustrates a further variation on the device of FIG. 13. In the device of FIG. 14, an upper Bragg mirror 55 is provided. However, it is just provided in the aperture 41 formed in mask layer 39.

There are two preferred methods of fabricating this structure. In the first method, the upper Bragg mirror is grown as part of the first growth directly on top of n-type layer 31.

P-type contacts and n-type contacts are formed in the same manner as described with reference to FIG. 2. Before forming the n-type contacts, the upper Bragg mirror is removed from the contact region such that the contacts can be placed on n-type layer 31.

The mesa is then defined using photo lithography as described with reference to FIG. 2. The first method of defining the mesa was used where the pattern of the photoresist and type of photoresist was chosen such that after development, photoresist remained only covering the mesa area. The mesa is then etched in the same manner as described with reference to FIG. 2.

The Al mask layer 39 is then formed. First, the layer is patterned using a photoresist and photoresist pattern such that after development, the whole device is covered with photoresist except for the area where the Al mask is to be formed. The central area of the mask with the aperture to be formed is also covered with photoresist to protect the Bragg mirror below. The Bragg mirror 55 is then etched down to the n-type layer 31. It should be noted that some of the Bragg mirror 55 has already been etched in order to provide the n-type contacts 35. This will not cause a problem as an etch can be chosen which will not affect the n-type contacts 35.

The Al mask is then deposited on the n-type layer 31 and a lift-off process is then conducted to remove aluminium which overlies photoresist.

As an alternative fabrication method, the growth of the device can be stopped at the top of the growth of n-type layer 31 and the upper Bragg mirror can be added as a separate evaporation of suitable dielectric layers.

The Bragg mirror may also be formed of alternate layers of $SiO_2$ and $TiO_2$. These dielectric layers have low absorption at the operational wavelength. For an operational wavelength of $\lambda=1.3$ μm, the thickness of the $SiO_2$ and $TiO_2$ layers are approximately 221 nm and 138 nm respectively. For $\lambda=1.5$ μm, the layers are 264 nm and 164 nm respectively.

This type of structure also has further advantages since only photons emitted from quantum dots in the active region are subjected to strong optical confinement. The dots emit into the optical mode of the cavity which enhances the radiative recombination rate of the dots in the cavity relative to the dots outside the cavity. The faster radiative recombination rate of the dots in the active region also helps to define the active region.

Figure 15:
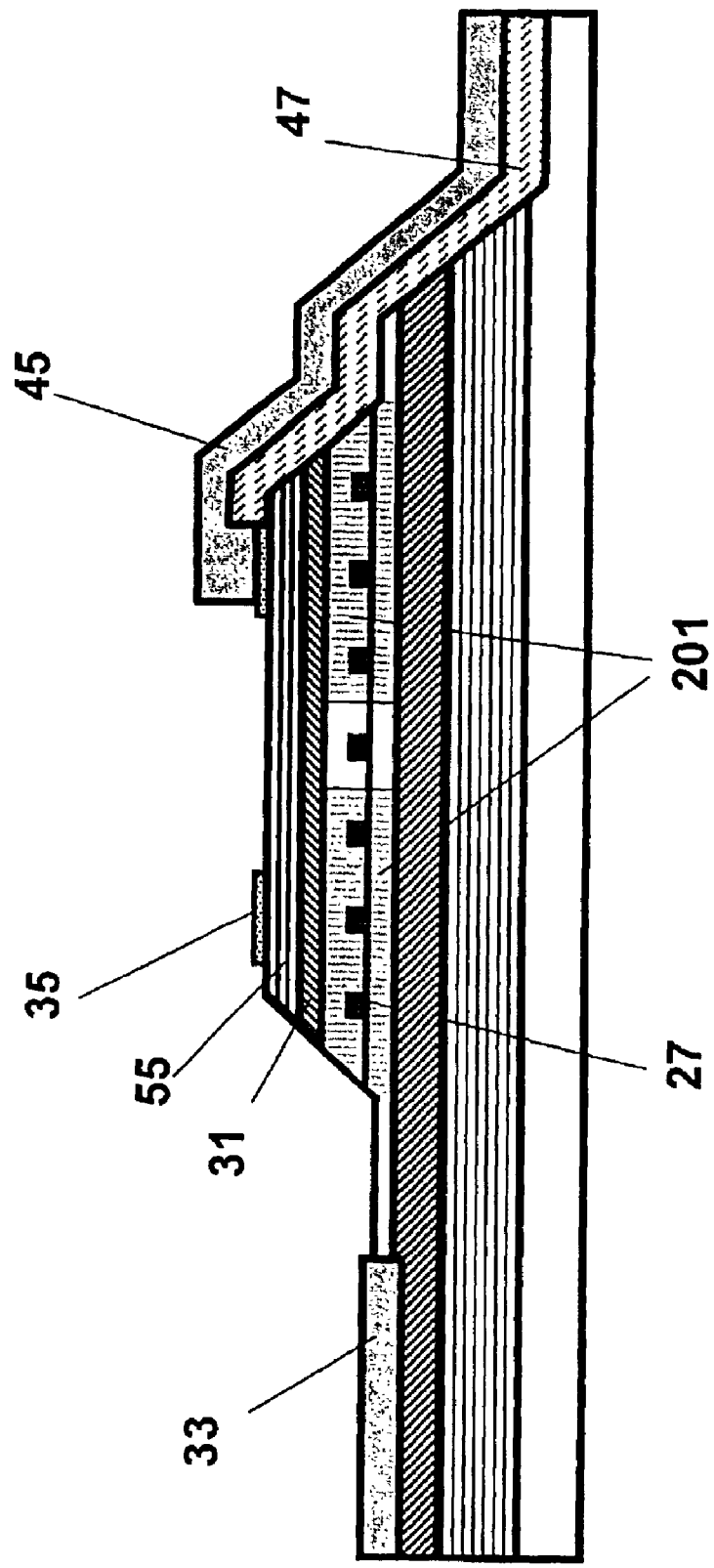
FIG. 15 illustrates a device in accordance with a sixth embodiment of the present invention.

FIG. 15 illustrates a device in accordance with a further embodiment of the present invention. The device of FIG. 15 has been ion beam damaged in order to define the active area.

In this device, the active area is defined by ion beam damage as opposed to by aluminium mask 39 as in the previous devices. Therefore, there is no need for the aluminium mask.

The structure is grown in the same manner as described with reference to FIG. 2 up to and including the formation of n-type layer 31. Growth is then stopped and the wafer is exposed to a focused ion beam which produces local damage to the lattice which reduces the radiation efficiency of these areas. A relatively large area 201 of the device is damaged (larger than the eventual mesa), an undamaged area is provided in the centre of the damaged area. Typically, this undamaged area will be about 1 μm in diameter. An upper Bragg mirror is then grown overlying and in contact with the n-type layer 31. Contacts are then made to the device in the same manner as described with reference to FIG. 2. However, it should be noted that no Al layer 39 is formed.

On operating the device, the dots in the area of the damaged lattice will not be able to emit photons. Only the dots in the active area which is undamaged can emit photons. Therefore, this device has the same advantages as the earlier described advantages in that it is still possible to make good ohmic contact to the top of the mesa while still allowing the device to have relatively few active dots or more preferably just one active dot.

Figure 16:
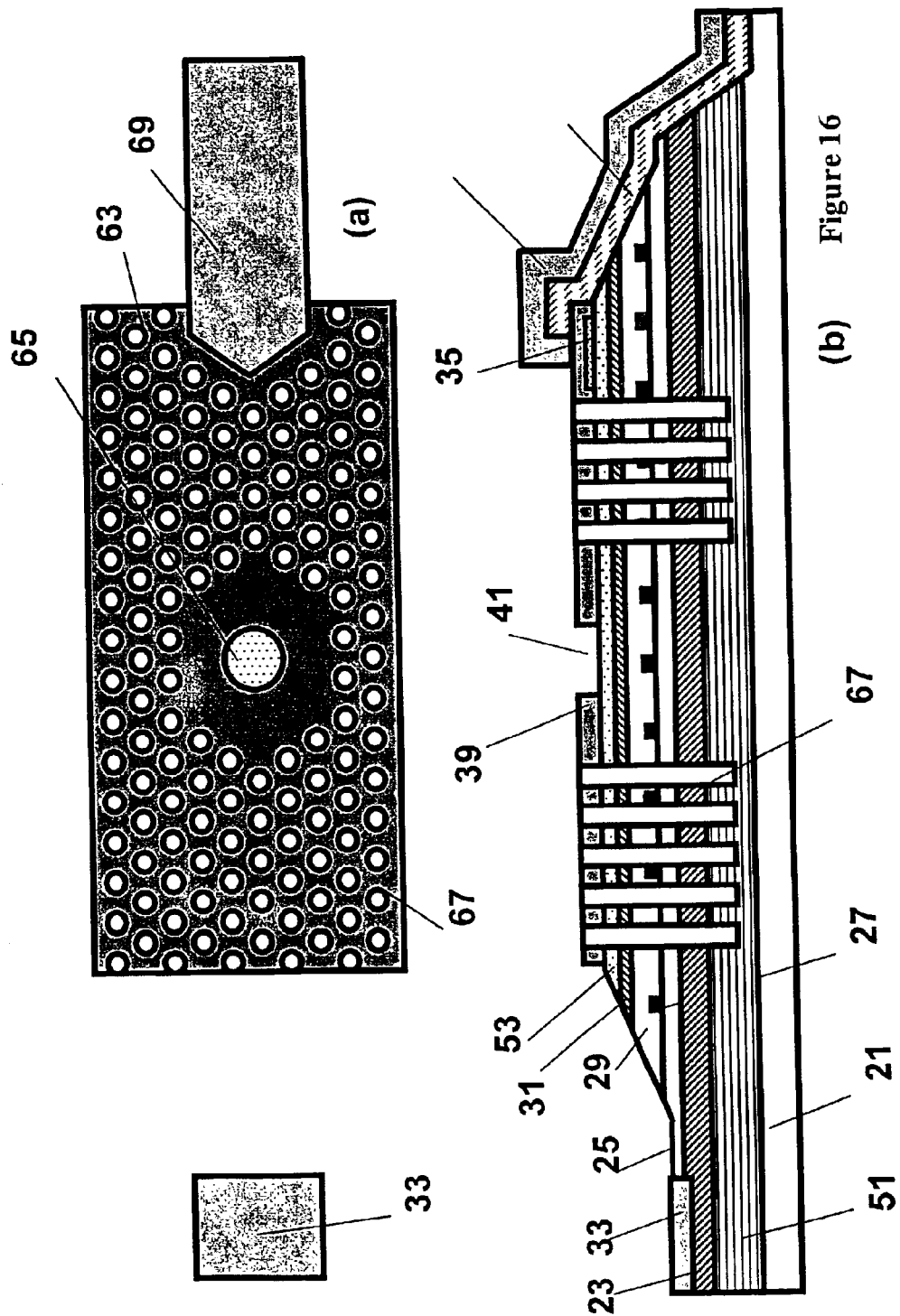
FIG. 16a illustrates a plan view of a device in accordance with a seventh embodiment of the present invention and FIG. 16b illustrates the corresponding cross-sectional view.

FIG. 16 illustrates a further variation on the device of FIG. 11. To avoid unnecessary repetition, like reference numerals are used to denote like features.

The device is fabricated in the same manner as that described with reference to FIG. 2. However, the active area is provided within a three dimensional optical cavity. Optical confinement in the third dimension i.e. in the dimension within the plane of the layers is achieved using a photonic band gap structure (PBG).

After the structure has been fabricated, a pattern of holes is etched through the layer structure. This pattern is clearly shown in FIG. 16a which is a plan view of the structure. In this plan view, 63 represents the upper surface of mask 39, the emission aperture 65 is located in the centre of this mask and holes 67 form the photonic structure. The mask 63 is contacted by contact pad 69. P-type ohmic contact 33 is provided on the opposing side of the mask to contact pad 69.

In the plan view of FIG. 16, the holes 67 extend into lower Bragg mirror 51. The holes 67 create a periodic variation in the refractive index which acts like a Bragg mirror in the plane of the layers.

The holes may extend into part of the lower Bragg mirror or they may extend through the entire Bragg mirror.

The holes are etched using reactive ion beam etching (RIE). Missing holes in the centre of the pattern define the cavity in the second and third dimensions. In this particular example, about one to seven missing holes are used. In this structure, the hole spacing will be from 300 to 700 nm with the hole diameter from 100 to 500 nm.

Figure 17:
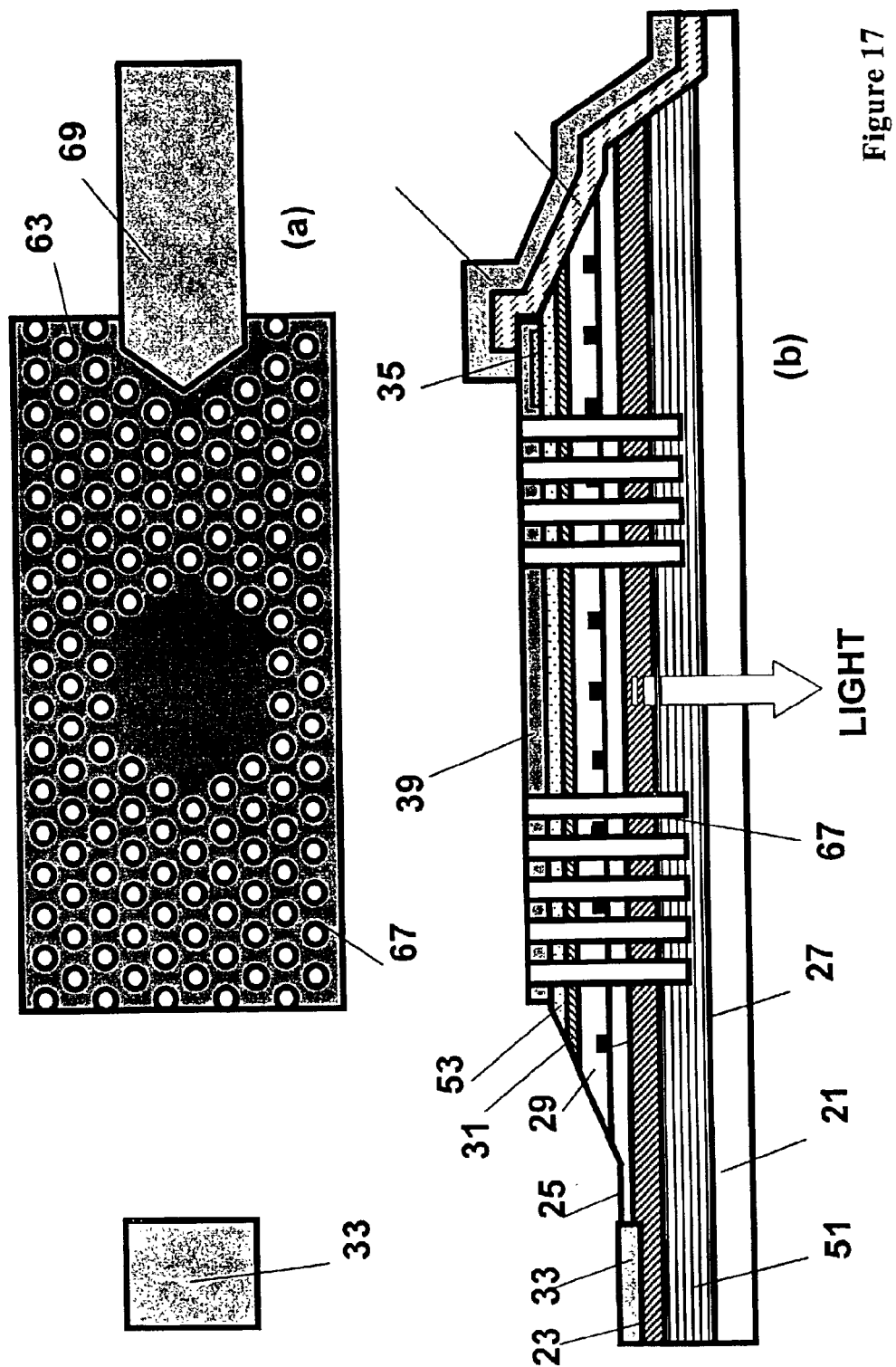
FIG. 17a illustrates a plan view of a device in accordance with an eighth embodiment of the present invention and FIG. 17b illustrates the corresponding cross-sectional view.

FIG. 17 illustrates a variation on the device of FIG. 16. FIG. 17a illustrates a plan view of the device and FIG. 17b is a cross-sectional view. To avoid unnecessary repetition, like reference numerals are used to denote like features.

The device is similar to that of FIG. 16, except that there is no emission aperture 65 provided in mask 39. Also, lower Bragg mirror 51 comprises fewer periods (for example 5).

Since the metal mask 39 is continuous in the cavity region, its reflectivity is maximised, in turn increasing the optical confinement. Emission from the dots in the cavity is isolated due to their coupling with the strong optical fields in the cavity. Thus, the cavity provides a spectral filter as photons emitted by dots whose energy is substantially equal to that of the cavity mode will be predominantly emitted.

In contrast to the other described devices, light is extracted from the bottom face of the device.

Figure 18:
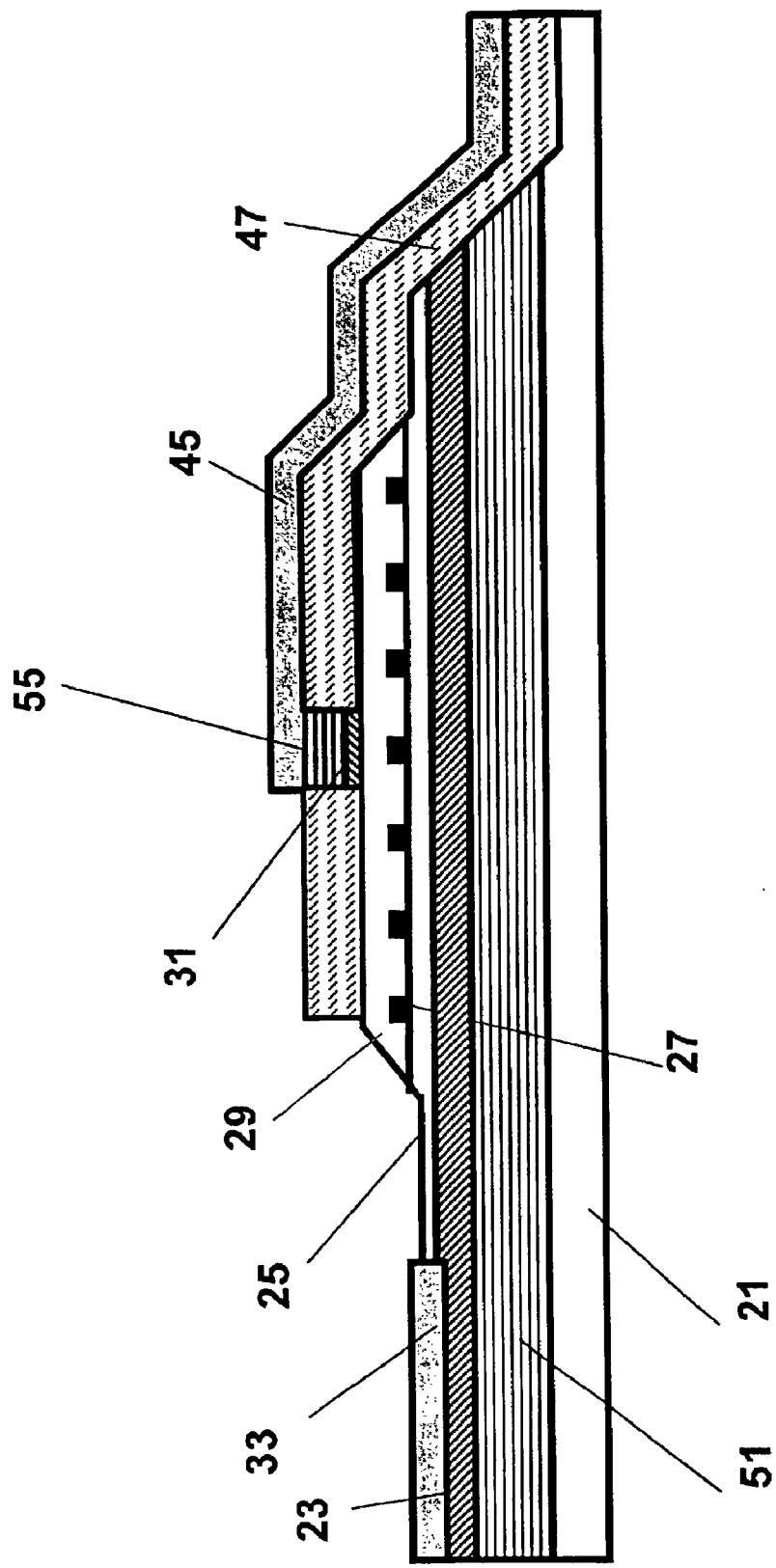
FIG. 18 illustrates a device in accordance with a ninth embodiment of the present invention.

FIG. 18 illustrates a further device in accordance with an embodiment of the present invention. In this structure, the active area is defined by reducing the size of the upper current injection area so that only a single or a limited number of dots of the plurality of dots can be injected and hence can emit photons.

The layer structure of the device is the same as that described with reference to FIG. 13. However, the layers are patterned in quite a different way. First, the mesa is defined in the same way as defined with reference to FIG. 2. It is then necessary to pattern n-type layer 31 so that only a small conducting region remains. The patterning may be achieved using either electron beam lithography or photolithography.

Depending on the materials used, the n-type layer and the upper Bragg mirror may be side oxidised to destroy the conductivity of the n-type layer 31 in regions away from the active area. This may be achieved if the n-type layer is formed from $Al_xGa_{1-x}As$ with x=0.3. Alternatively, the layers may simply be etched away. If the layers are etched, then it is necessary to provide an insulator on the top of the mesa to ensure that the contact metal does not short to the other layers in the device. As the contact metal will directly overlie the active area, it is important to use a contact metal which is transparent to radiation of the desired wavelength, such as indium tin oxide.

Figure 19:
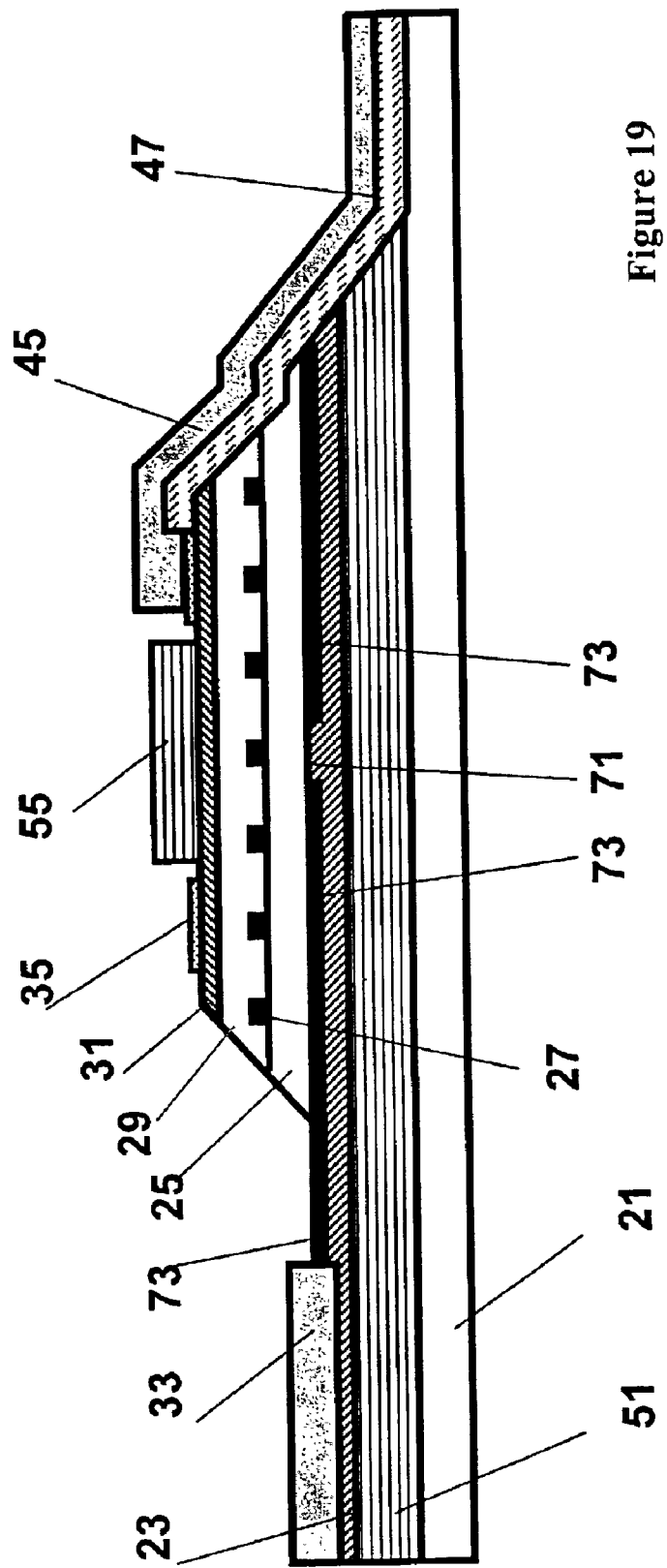
FIG. 19 illustrates a device in accordance with a tenth embodiment of the present invention.

FIG. 19 again illustrates a device where a reduced current injection area is used in order to define the active area of the device. In FIG. 18, the upper n-type layer 31 was patterned such that it could only inject over a small area. In FIG. 19, the lower contact is patterned in this manner.

The device is formed in the same manner as that described with reference to FIG. 11 up to the formation of p-type layer 23. At this point either the growth is stopped and the p-type layer is damaged with an ion beam or an Al containing layer is inserted which can later be selectively oxidised such that only small area 71 of the layer is conducting across its full thickness. Thus, by oxidising or damaging the layer, an insulating mask 73 with aperture 71 is provided in the p-type layer 23. It should be noted that only the top of the layer should have its conductivity destroyed. This is because it is important that electrical contact can still be made to the p-type layer 23.

If current mask 73 is developed by oxidising part of p-type layer 23, the p-type layer preferably comprises AlAs or $Al_xGa_{1-x}As$. This layer may be oxidised after the formation of the mesa to form aluminium oxide. In this fabrication technique, the mesa is etched as far as the p-type layer 23. Oxidation is then achieved by flowing $N_2$ which has been bubbled through water at 90° C. over the device. The device is held at a temperature of 425° C. in a suitable furnace. Through careful control of the time in the furnace, the spread of the oxidation can be controlled in order to just define a small central area 71.

If this technique is used, the upper Bragg mirror is preferably formed after epitaxial growth of the device. The Bragg mirror may comprise dielectric layers of $SiO_2$ and $TiO_2$.

FIG. 20 illustrates a variation on the structure of FIG. 2 which has a double barrier resonant tunnelling structure. The use of resonant tunnelling for injected carriers into the quantum dot has been described with reference to FIGS. 7 to 10. The device of FIG. 20 resonantly injects holes into the dot through a double barrier structure.

The structure is similar to that described with reference to FIG. 2. To avoid unnecessary repetition like reference numerals will be used to denote like features. A first GaAs instrinsic layer 203 which has a thickness of 250 nm is formed overlying and in contact with lower doped layer 23.

A first tunnel barrier layer 205 is then formed overlying and in contact with the GaAs instrinsic layer 203. The first tunnel barrier 205 comprises up to 5 nm of AlAs. A barrier spacer layer 207 is then formed overlying and in contact with said first tunnel barrier 205. The barrier spacer layer 205 comprises up to 5 nm of undoped GaAs. A second tunnel barrier layer 209 is then formed overlying and in contact with said barrier spacer layer 207. Said second tunnel barrier 209 comprising up to 5 nm of AlAs.

A further GaAs layer is then formed as first instrinsic layer 25. First intrinsic layer 25 comprises 250 nm of GaAs. The remainder of the structure is then formed as described in relation to FIG. 2.

The device allows the resonant injection of holes into the device. Resonant injection occurs when the device is biased such that hole in lower doped layer 23 has the same energy as that of an energy level in barrier spacer layer 207. A further variation (not shown) that instead allows resonant injection of electrons, is fabricated by growing the double barrier structure after the InAs layer, not before it. In this case, the sequence of layers 203 to 209 is reversed.

The device of FIG. 20 which has a double barrier resonant tunnelling diode (RTD) structure can provide very short bursts of current into a photon emitting device, even if the external modulation of voltage is at a relatively low frequency. The advantage of this type of current injection is that the high frequency response of external components, such as the contact pads, bond wires, and power supply leads, is not as critical as for an ordinary p-i-n device. The operation of an RTD is as follows.

FIG. 21(a) illustrates a schematic conduction band diagram of a double barrier structure of the type described with reference to FIG. 20. However, here, electrons are resonantly injected as opposed to holes. For clarity, like reference numerals are used to denote like features. Two thin (approximately 5 nm) barrier regions of AlAs are separated by a thin barrier spacer of GaAs. If an electric field is applied across the device, then the energy of electron reservoir 211 which may be located in n-doped layer 31, is shifted up towards the first confined electron level 213 between the barriers. When the two levels align, strong tunnelling occurs through the double barrier structure, and a current flows.

FIG. 21(b) illustrates the current/voltage characteristics of the device. Peak 212 corresponds to the situation where the energy level 211 of the carriers in the reservoir 213 aligns with the energy level 213 in the barrier spacer 207.

When the electric field is increased even further, the levels 211 and 213 become non-resonant, and the current drops, as seen in the valley feature 214 in 21(b).

If the source voltage is swept across this resonance as a function of time as shown in FIG. 21(c), the current as a function of time is shown by d. The width of the peaks in the current as a function of time is determined by both the width of the peak in the current-voltage characteristics, and by the derivative of the applied voltage as a function of time. The result is much shorter bursts of current than by direct electrical injection. Thus, the device can be operated at a relatively low frequency while still providing short current bursts such that only one photon is emitted per cycle per dot.

In a single photon emitting diode, holes must also be provided. The holes may be provided by diffusion in the same way as previously described, as the emission of photons requires both electrons and holes, and therefore can be limited by the electron supply. To avoid the emission of photons at times other than those corresponding to the peak current and hence to limit uncontrolled emission, it is desirable to reduce the valley current $I_v$, by having a very large peak to valley ratio $I_p/I_v$, as shown on 21b. This can be achieved if only weak doping is used in the GaAs surrounding the double barrier.

FIG. 22 shows the device of FIG. 13 modified to allow resonant tunnelling of electrons into the dots using a double quantum well type structure.

The device comprises a buffer layer 21. A lower Bragg reflector 223 is formed overlying and in contact with said buffer layer 21. Said lower Bragg reflector 223 comprises alternate layers of $Al_{0.3}Ga_{0.7}As/AlAs$. Barrier layer 225 is then formed overlying and in contact with said lower Bragg reflector 223. Said Barrier layer 225 comprises 95 nm of $Al_{0.3}Ga_{0.7}As$.

A p-type injection layer 227 is then formed overlying and in contact with said barrier layer 225. Said p-type injection layer 227 comprises 40 nm thick of $Al_{0.3}G_{0.7}As$ doped with Be at a concentration of $1\times10^{18}$ cm$^{-3}$. Undoped layer 229 is then formed overlying and in contact with said p-type injection layer 227. Undoped layer 229 comprises 40 nm of undoped $Al_{0.3}Ga_{0.7}As$.

The first half 231 of a first quantum well 232 is formed overlying and in contact with undoped layer 229. Said first half 231 of the quantum well comprises 10 nm of undoped GaAs. Quantum dot layer 27 is then formed as described in relation to FIG. 2 on said first half 231 of the first quantum well 231. The second half 233 of the first quantum well 232 is then formed overlying and in contact with said first half 231 and dot layer 27. The second half 233 comprises 10 nm of undoped GaAs.

First barrier layer 235 is provided overlying and in contact with said second half 233 of quantum well layer 232. Said first barrier layer 235 comprises 20 nm of undoped $Al_{0.3}Ga_{0.7}As$. Second quantum well 237 is then formed overlying and in contact with the first barrier layer. The second quantum well layer comprises 20 nm of undoped $In_{0.5}Ga_{0.5}As$.

Next, a 155 nm thick intrinsic GaAs layer 239 is formed overlying and in contact with the second quantum well 237. A 30 nm thick n$^+$-type GaAs injector layer 241 is formed overlying and in contact with said intrinsic GaAs layer 239.

Next, phase matching layer 243 provided overlying and in contact with said injector layer 241. Said phase matching layer comprises 70 nm of n$^+$-type GaAs.

The layers are then processed in the same manner as for previously described devices, except that the first mesa etching process only penetrates the n+ layer 241, and not all the way through the dot layer 27.

In operation, the device is configured so that doped barrier layer 227 supplies holes to dot layer 27, thus the quantum dots are always populated by holes. Injection layer 241 can be biased with respect to dot layer 27 such that electrons are induced in the quantum well injection layer 237.

Electrons can be injected into the quantum dot layer 27 due to resonant tunnelling through tunnel barrier 235 by varying the bias across the sample. The bias is cycled between the voltage for resonant electron injection $V_1$ and a lower voltage $V_2$ to allow periodic injection of an electron, and hence emission of a photon.

The voltage level $V_2$ is chosen so that the electron energy level in the injection level is lower than that in the quantum dot. This is shown in FIG. 23. For clarity, the layers in FIG. 23 have kept the same reference numerals as those in FIG. 22.

The electrons in the electron injection layer 237 have an energy 245. In order to resonantly tunnel through barrier 235 into quantum dot layer 27, the electrons must have an energy equal to that of level 247 shown in the quantum dot. In the $V_2$ state, the electrons do not have this energy. Therefore, no tunnelling can take place and hence, no recombination of electrons with holes in the dot can occur.

FIG. 24 shows the state where the potential of the injection gate 241 is raised to $V_1$. Under these conditions, the band structure of the device changes so that energy level 245 in the electron injection layer 237 aligns with energy level 245 of the quantum dot and resonant tunnelling of a single electron can occur from injection layer 237 through tunnel layer 235 into quantum dot layer 27. Thus, recombination can occur and a photon can be emitted. It is clear, that as the tunnelling is controlled by switching the potential between $V_1$ and $V_2$, the control of single photons can be achieved.

Variations on the layer structure of devices in accordance with embodiments of the present invention have been described with reference to FIG. 2 and FIGS. 11 to 24. However, further variations on these structures are also possible. In each of the structures, the p-type layer is a buried layer. However, the p-type layer may be formed in place of n-type layer 31 and the n-type layer may be formed as buried layer 23. Further, any epitaxial growth technique may be used. MBE has been explicitly described. However, techniques such as MOCVD may also be used.

Further, it is also possible to combine features of the different devices together. For example, the three dimensional cavities formed in FIG. 16 may be used in any of the other devices. Further, the devices which use selective current injection, for example, FIGS. 18 and 19 may be used in combination with those which use a mask with a small aperture in order to block emission.

Also, a plurality of active regions may be defined in a single mesa. The dots within each active region being injected with carriers from the same contacts.

Most of the above devices emit radiation through the top of the mesa. In other words, through the opposite side of the device to the substrate. However, the device may be configured such that light is emitted from the substrate side of the device. This may be achieved by making the mirror or other reflecting member on the substrate side of the source more transparent to radiation of the required wavelength than the mirror or reflecting member on the opposite side of the active region. Also, it is possible to emit radiation in the plane of the layers, this may be achieved by forming a three dimensional cavity of the type described with reference to FIG. 16 and reducing the number of repeats of the pattern of holes in one direction to encourage emission of radiation in this direction.

FIG. 25 illustrates an experimental arrangement for collecting the output from the source body described in relation to any of the preceding figures. 101 represents a photon source which may be any of those described with reference to FIG. 2 or FIGS. 11 to 24. Output from source 101 is then collected by lens 103 and is focused into fibre optic coupling fibre 105.

The output from fibre output coupling 105 is then collected by lens 107 and directed into the spectrometer 109. Spectrometer 109 is tuned to pass radiation at a specific wavelength. If it is desired to collect photons which arise from simple single exciton decay, then spectrometer 109 is tuned to the simple exciton wavelength for the emitting dot. If a plurality of dots are located in the active area of the device 101, then the spectrometer may be tuned to just allow the passage of photons arising from the desired exciton transition from a particular dot.

As the dots are emitting photons at a predetermined time interval, collecting the output of just one dot allows a stream of single photons to be obtained. The output from spectrometer 109 is then collected by lens 111 and directed into output fibre 113 for use as required.

Even if only one dot is emitting in the device, spectrometer 109 is still desirable because there is likely to be spurious emissions from other parts of device 101.

In FIG. 25, the spectrometer 109 is provided remote from device 101. However, in practice, means may be provided on the actual device itself in order to filter out spurious emissions. For example, a diffraction grating or interference filter may be provided on the upper surface of the device, or the dot may be placed in a resonant cavity.

FIG. 26 shows a variation on the experimental arrangement of FIG. 25. To avoid unnecessary repetition, like reference numerals will be used to denote like features.

In FIG. 26, device 101 emits photons, these are collected by convex lens 115 and directed onto spectral filter 117 which operates in a similar manner to that of spectrometer 109. The output from spectral filter 117 is then collected by second convex lens 119 and directed into output fibre 113.

The apparatus described with reference to FIGS. 25 and 26 may also be tuned to collect the emission from a bi-exciton decay. Bi-exciton decay occurs when a quantum dot traps two electrons and two holes. The first electron and hole will recombine to emit a photon at the bi-exciton transition energy, then the remaining electron and hole will combine to emit a single simple exciton.

The dot can emit a pair of photons; one photon due to a bi-exciton transition, followed by another photon due to a single exciton transition. Photon pairs have been proposed for many uses in quantum communication information technology.

FIG. 27 illustrates a variation on the apparatus of FIG. 25 which is used to collect an entangled photon pair. To avoid unnecessary repetition, like reference numerals will be used to denote like features. Spectrometer 109 is configured to pass both photons arising from a bi-exciton transition and the corresponding single exciton transition from a desired dot. The output of spectrometer 109 is then collected by convex lens 121 and directed onto dichoric mirror 123. The dichoric mirror is configured to pass photons of a certain energy and reflect other photons. Therefore, photons passed by the dichoric mirror are collected by lens 125 and passed into first output fibre 127, photons reflected by dichoric mirror 123 are collected by lens 129 and are passed into second output fibre 131. Dichoric mirror 123 is configured so that it can distinguish between photons from a single exciton transition and a bi-exciton transition.

FIG. 28 shows a further variation on the apparatus of FIG. 27. Here, photons from the bi-exciton transition and the single exciton transition are separated before the signal is filtered. In this example, lens 133 collects photons emitted from device 101 and directs them onto dichoric mirror 135. Photons reflected from dichoric mirror 135 are collected by lens 137 and directed into spectrometer 139. Spectrometer 139 is configured to pass photons only with the energy corresponding to either bi-exciton or single exciton transition of the desired dot. For example, if the dichoric mirror 135 is configured to reflect photons having an energy of the single exciton transition, then spectrometer 139 is also configured to only pass photons with this transition energy. The output of spectrometer 139 is then collected by lens 141 and directed into first output cable 143.

If dichoric mirror 135 is configured to reflect photons having an energy close to that of the desired single exciton transition, then the mirror passes photons having an energy close to the bi-exciton transition. These photons are collected by lens 145 and directed onto spectrometer 147. Spectrometer 147 is then configured to only pass photons having an energy equal to that of the desired bi-exciton transition. The photons are then collected by lens 149 and directed into second output cable 151. Therefore, as the emission from just one dot can be collected, one photon from a photon pair can be sent down first output fibre 143 and the other photon of the photon pair can be sent down fibre 151.

FIG. 29 shows a further variation on the apparatus of FIG. 27 for collecting photons from a photon pair and splitting the pair such that one photon is directed down one fibre and the other photon of the pair is directed down another fibre.

The photons are collected and directed into spectrometer 109 in the same manner as described with reference to FIG. 27. Like reference numerals are used to denote like features. The spectrometer is configured to pass photons arising from the bi-exciton transition and the single exciton transition of the same quantum dot. In FIG. 27, the spectrometer has a single output and both photons were emitted through this output. In the spectrometer 109, both photons are emitted through separate outputs 153 and 155. The photons from both outputs are collected by lens 157. Lens 157 is capable of directing photons into either a first output fibre 159 or a second output fibre 161. Which fibre is selected is dependent on the incident angle of the photons on lens 157. Therefore, photons emitted through a spectrometer output 153 can be directed into output fibre 161 and photons emitted through spectrometer output 155 can be directed into output fibre 159.

FIG. 30 shows a variation on the apparatus of FIG. 29. The apparatus is the same as that of FIG. 29 up to spectrometer 109. In the same manner as FIG. 29, photons with one energy are emitted through output 153 and photons having a second energy are emitted through output 155. Photons emitted through output 155 are reflected by mirror 215 and are then collected by lens 217. Lens 217 directs the reflected photons into fibre 161. Photons from output 153 are directed into fibre 159 by lens 157 as described with reference to FIG. 29.

FIG. 31 shows a further variation of FIG. 23, but to collect both the exciton and biexciton emission. The photons are first directed from the source body 101 towards a spectral filter 221 by lens 103. Spectral filter 221 is an interference filter with a narrow bandpass of less than 1 nm.

Filter 221 transmits one of the photons, for example the exciton photon, and reflects other wavelengths, in this example including the biexciton photon. The transmitted photons are then focused onto fibre optic 159 by lens 157. The reflected photons are then further filtered by spectral filter 219, which in this example will have peak transmission at the wavelength of the biexciton photon. The biexciton photon is transmitted, and focussed onto fibre optic 161 by lens 217.

What is claimed is:

1. A photon source comprising:
    a photon source body including,
        a plurality of quantum dots,
        a non-insulating layer overlying and in contact with the plurality of quantum dots, and
        at least one electrical contact configured to allow electrically activated emission of radiation from at least one of the quantum dots; and
    means for defining an active region within said photon source body such that emission is only collected from a dot or a limited number of dots within said active region.

2. The photon source of claim 1, wherein said means for defining an active region comprises:
    an emission member having a body with an aperture, said aperture being positioned such that emission from dots in the active region is transmitted through said aperture.

3. The photon source of claim 1, further comprising:
    a first current injection region configured to inject carriers of a first conductivity type into the dots.

4. The photon source of claim 3, wherein said first current injection region only injects carriers into the dots in the active region.

5. The photon source of claim 3, wherein the first current injection region comprises:
    a doped semiconductor layer configured to inject carriers having at least one conductivity type into the quantum dots; and
    an energy varying device configured to vary the energy of the carriers injected from said doped semiconductor layer.

6. The photon source of claim 5, wherein the first current injection region further comprises:
    a double barrier structure provided between said doped semiconductor layer and the plurality of dots, said double barrier structure including two barrier layers separated by a spacer layer and configured to allow carriers of a predefined energy to resonantly tunnel through said structure and into said plurality of dots.

7. The photon source of claim 3, further comprising:
    a carrier supplier configured to supply excess carriers of a second conductivity type, opposite to the first conductivity type to the quantum dots.

8. The photon source of claim 3, further comprising:
    a second current injection region configured to inject carriers having a second conductivity type, opposite to that of the first conductivity type into the quantum dots.

9. The photon source of claim 8, wherein the second current injection region injects carriers just into the active region.

10. The photon source of claim 1, wherein said active region is provided in an optical cavity.

11. The photon source of claim 10, wherein said plurality of dots are provided in a dot layer or a plurality of dot layers and wherein a variation in the refractive index is provided in the plane of said dot layer or layers.

12. The photon source of claim 11, wherein said variation in the refractive index is provided by a pattern of holes which extend through said layer or layers and wherein said active region is provided at an irregularity in said pattern.

13. The photon source of claim 1, wherein the dots in the active region have a faster radiative recombination rate than the dots outside the active region.

14. The photon source of claim 1, wherein the non-radiative recombination rate is lower for the dots in the active region than the other dots.

15. The photon source of claim 1, further comprising:
    a filter configured to only pass photons having the desired wavelength.

16. The photon source of claim 15, wherein the filter is provided by an optical cavity in the photon source body.

17. The photon source of claim 15, wherein the filter passes photons having one of two distinct wavelengths.

18. The photon source of claim 17, wherein the filter transmits photons having either the energy of the single exciton emission or the energy of the bi-exciton emission.

19. The photon source of claim 17, wherein the filter transmits photons having one of said energies along a first trajectory and photons having the other of said energies along a second trajectory, wherein the first and second trajectories are spatially distinct.

20. The photon source of claim 17, further comprising:
    a directing device configured to direct photons having one of said energies along a first trajectory and photons having the other of said energies along a second trajectory, wherein the first and second trajectories are spatially distinct.

21. The photon source of claim 1, wherein there is a variation in the carrier energy levels of the quantum dots, the photon source further comprising:
    a carrier injector configured to inject carriers at a predetermined energy such that only certain dots are populated by carriers.

22. The photon source of claim 1, further comprising:
    a bias applying device configured to apply a pulsed bias across the photon source body.

23. A photon source comprising:
    a photon source body including,
        a plurality of quantum dots,
        a non-insulating layer overlying and in contact with the plurality of quantum dots, and
        at least one electrical contact configured to allow electrically activated emission of radiation from at least one of the quantum dots; and
    a limiting device configured to limit the number of dots which contribute to the output of the photon source.

24. The photon source of claim 23, wherein the limiting device comprises:
    a filter configured to spectrally filter the output of the photon source.

25. The photon source of claim 23, wherein the limiting device limits the number of dots based on the positions of the dots within the photon source body.

26. The photon source of claim 23, wherein there is a variation in the energy levels of the plurality of dots and wherein the limiting device comprises:
    a carrier injector configured to electrically inject carriers with an energy such that only certain dots will emit photons.

27. A method of operating a photon source including a plurality of quantum dots, a non-insulating layer overlying and in contact with the plurality of quantum dots, and a contact configured to allow electrically activated emission from a plurality of said quantum dots, the method comprising:

applying an electrical signal to said contact to allow electrically activated emission from said plurality of quantum dots; and allowing emission only from a limited number of said plurality of quantum dots.

28. A method of forming a photon source, the method comprising:

forming a plurality of quantum dots;

forming a non-insulating layer overlying and in contact with the plurality of quantum dots;

forming an electrical contact configured to allow electrically activated emission from the plurality of quantum dots; and forming an emission member configured to allow emission to be collected from a limited number of dots.

29. A method of forming a photon source, the method comprising:

forming a plurality of quantum dots;

forming a non-insulating layer overlying and in contact with the plurality of quantum dots;

forming an injection region configured to allow electrically activated emission from the plurality of quantum dots;

forming an electrical contact to said injection region; and forming an insulating mask to allow electrical injection to only a limited number of said dots.

30. A method of forming a photon source, the method comprising:

forming a plurality of quantum dots;

forming a non-insulating layer overlying and in contact with the plurality of quantum dots;

forming an injection region configured to allow electrically activated emission from a limited number of said quantum dots; and forming an electrical contact to said injection region.

31. A photon source comprising:

a photon source body including,
    a plurality of layers, and
    a plurality of quantum dots arranged in one or more layers of the plurality of layers;

an electrical contact contacted to the photon source body and configured to apply an electrical signal across the photon source body and to allow electrically activated emission of radiation from at least one of the quantum dots; and means for defining an active region within said photon source body such that emission is only collected from a dot or a limited number of dots within said active region.

32. The photon source of claim 1, wherein the non-insulating layer is a semiconductor.

33. The photon source of claim 23, wherein the non-insulating layer is a semiconductor.

34. The method of claim 27, wherein the non-insulating layer is a semiconductor.

35. The method of claim 28, wherein the non-insulating layer is a semiconductor.

36. The method of claim 29, wherein the non-insulating layer is a semiconductor.

37. The method of claim 30, wherein the non-insulating layer is a semiconductor.

* * * * *